(12) United States Patent
Gao et al.

(10) Patent No.: US 8,102,140 B2
(45) Date of Patent: Jan. 24, 2012

(54) METHOD AND APPARATUS FOR ESTIMATING INDUCTION MOTOR ELECTRICAL PARAMETERS

(75) Inventors: Zhi Gao, Raleigh, NC (US); Larry A. Turner, Chapel Hill, NC (US); Roy S. Colby, Raleigh, NC (US)

(73) Assignee: Schneider Electric USA, Inc., Palatine, IL (US)

( * ) Notice: Subject to any disclaimer, the term of this patent is extended or adjusted under 35 U.S.C. 154(b) by 520 days.

(21) Appl. No.: 12/268,831

(22) Filed: Nov. 11, 2008

(65) Prior Publication Data

US 2009/0284211 A1 Nov. 19, 2009

Related U.S. Application Data

(60) Provisional application No. 61/053,941, filed on May 16, 2008.

(51) Int. Cl.
*H02P 23/14* (2006.01)

(52) U.S. Cl. ........ 318/727; 318/798; 318/807; 318/700; 318/690; 318/715

(58) Field of Classification Search .................. 318/727, 318/798, 807, 700, 690, 715, 721
See application file for complete search history.

(56) References Cited

U.S. PATENT DOCUMENTS

| | | | |
|---|---|---|---|
| 4,114,077 A | 9/1978 | Oates et al. | |
| 4,441,065 A | 4/1984 | Bayer et al. | |
| 4,884,023 A | 11/1989 | Schmidt et al. | |
| 4,914,386 A | 4/1990 | Zocholl | |
| 5,232,285 A | 8/1993 | Mannik | |
| 5,257,863 A | 11/1993 | Chu et al. | |
| 5,436,784 A | 7/1995 | Schweitzer, III et al. | |
| 5,477,162 A | 12/1995 | Heikkilä | |
| 5,559,419 A | 9/1996 | Jansen et al. | |
| 5,565,752 A | 10/1996 | Jansen et al. | |
| 5,585,709 A | 12/1996 | Jansen et al. | |
| 5,689,169 A | 11/1997 | Kerkman et al. | |
| 5,729,113 A | 3/1998 | Jansen et al. | |
| 5,861,728 A | 1/1999 | Tazawa et al. | |
| 5,965,995 A | 10/1999 | Seibel et al. | |
| 6,042,265 A * | 3/2000 | Kliman et al. | ............ 374/152 |
| 6,281,659 B1 | 8/2001 | Giuseppe | |
| 6,388,420 B1 | 5/2002 | Jansen et al. | |
| 6,452,360 B1 | 9/2002 | Colby | |

(Continued)

OTHER PUBLICATIONS

C. Schauder, "Adaptive speed identification for vector control of induction motors without rotational transducers," *IEEE Trans. Ind. Appl.*, vol. 28, No. 5, pp. 1054-1061, Sep./Oct. 1992.

(Continued)

*Primary Examiner* — Walter Benson
*Assistant Examiner* — David Luo

(57) ABSTRACT

A method and apparatus to provide estimates of electrical parameters for line-connected induction motors during either steady-state or dynamic motor operations. The electrical parameters are calculated from the motor nameplate data and voltage and current measurements. No speed sensors or electronic injection circuits are needed. The method can be divided into 4 major steps. First, complex space vectors are synthesized from voltage and current measurements. Second, the instantaneous rotor speed is detected by calculating the rotational speed of a single rotor slot harmonic component with respect to the rotational speed of the fundamental frequency component. Third, the positive sequence fundamental frequency components are extracted from complex space vectors. Finally, least-squares estimates of the electrical parameters are determined from a dynamic induction motor equivalent circuit model.

39 Claims, 17 Drawing Sheets

U.S. PATENT DOCUMENTS

| | | | |
|---|---|---|---|
| 6,636,012 B2 | 10/2003 | Royak et al. | |
| 6,774,664 B2 | 8/2004 | Godbersen | |
| 6,862,538 B2 | 3/2005 | El-Ibiary | |
| 7,135,830 B2 | 11/2006 | El-Ibiary | |
| 7,184,902 B2* | 2/2007 | El-Ibiary | 702/60 |
| 7,389,409 B2 | 6/2008 | Swanson et al. | |
| 7,560,895 B2* | 7/2009 | Arnet | 318/778 |

OTHER PUBLICATIONS

A. Ferrah, K. J. Bradley, and G. M. Asher, "An FFT-based novel approach to noninvasive speed measurement in induction motor drives," *IEEE Trans. Instrum. Meas.*, vol. 41, No. 6, pp. 797-802, Dec. 1992.

P. L. Jansen and R. D. Lorenz, "Transducerless position and velocity estimation in induction and salient AC machines," *IEEE Trans. Ind. Appl.*, vol. 31, No. 2, pp. 240-247, Mar./Apr. 1995.

K. D. Hurst and T. G. Habetler, "Sensorless speed measurement using current harmonic spectral estimation in induction machine drives," *IEEE Trans. Power Electron.*, vol. 11, No. 1, pp. 66-73, Jan. 1996.

R. Blasco-Gimenez, G. M. Asher, M. Sumner, and K. J. Bradley, "Performance of FFT-rotor slot harmonic speed detector for sensorless induction motor drives," *IEE Proc. B, Electr. Power Appl.*, vol. 143, No. 3, pp. 258-268, May 1996.

R. Blasco-Gimenez, K. D. Hurst, and T. G. Habetler, "Comments on 'Sensorless speed measurement using current harmonic spectral estimation in induction machine drives' [and reply]," *IEEE Trans. Power Electron.*, vol. 12, No. 5, pp. 938-940, Sep. 1997.

K. D. Hurst and T. G. Habetler, "A comparison of spectrum estimation techniques for sensorless speed detection in induction machines," *IEEE Trans. Ind. Appl.*, vol. 33, No. 4, pp. 1-8, Jul./Aug. 1997.

K. D. Hurst, T. G. Habetler, G. Griva, F. Profumo, and P. L. Jansen, "A self-tuning closed-loop flux observer for sensorless torque control of standard induction machines," *IEEE Trans. Power Electron.*, vol. 12, No. 5, pp. 807-815, Sep. 1997.

J. Holtz, "Sensorless position control of induction motors—An emerging technology," *IEEE Trans. Ind. Electron.*, vol. 45, No. 6, pp. 840-851, Dec. 1998.

A. Bellini, G. Franceschini, E. Lorenzani, C. Tassoni, and F. Filippetti, "Sensorless speed detection in induction machines," in *Proc. Int. Conf. Electrical Machines (ICEM)*, Bruges, Belgium, Aug. 25-28, 2002.

A. M. Salamah, S. J. Finney, and B. W. Williams, "Three-phase phase-lock loop for distorted utilities," *IET Electr. Power Appl.*, vol. 1, No. 6, pp. 937-945, Nov. 2007.

Z. Gao, T. G. Habetler, R. G. Harley, and R. S. Colby, "A sensorless rotor temperature estimator for induction machines based on a current harmonic spectral estimation scheme," *IEEE Trans. Ind. Electron.*, vol. 55, No. 1, pp. 407-416, Jan. 2008.

M. Blodt, P. Granjon, B. Raison, and G. Rostaing, "Models for bearing damage detection in induction motors using stator current monitoring," *IEEE Trans. Ind. Electron.*, vol. 55, No. 4, pp. 1813-1822, Apr. 2008.

Guan-Chyun Hsieh and James C. Hung, "Phase-Locked Loop Techniques—A Survey", IEE Transactions on Industrial Electronics, vol. 43, No. 6, Dec. 1996.

A. V. Oppenheim, R. W. Schafer, and J. R. Buck, *Discrete-Time Signal Processing*, 2nd ed. Upper Saddle River, NJ: Prentice-Hall, 1999, pp. 482-485.

J. Stephan, M. Bodson, and J. Chiasson, "Real-time estimation of the parameters and fluxes of induction motors", *IEEE Trans. Ind. Appl.*, vol. 30, No. 3, May/Jun. 1994.

L. A. S. Ribeiro, C. R. Jacobina, A. M. N. Lima, and A. C. Oliveira, "Parameter sensitivity of MRAC models employed in IFO-controlled AC motor drive," *IEEE Trans. Ind. Electron.*, vol. 44, No. 4, pp. 536-545, Aug. 1997.

M. Cirrincione, M. Pucci, G. Cirrincione, and G.-A. Capolino, "A new experimental application of least-squares techniques for the estimation of the induction motor parameters," *IEEE Trans. Ind. Appl.*, vol. 39, No. 5, pp. 1247-1256, Sep./Oct. 2003.

*IEEE Standard Test Procedure for Polyphase Induction Motors and Generators*, IEEE Standard 112-2004, Nov. 2004.

\* cited by examiner

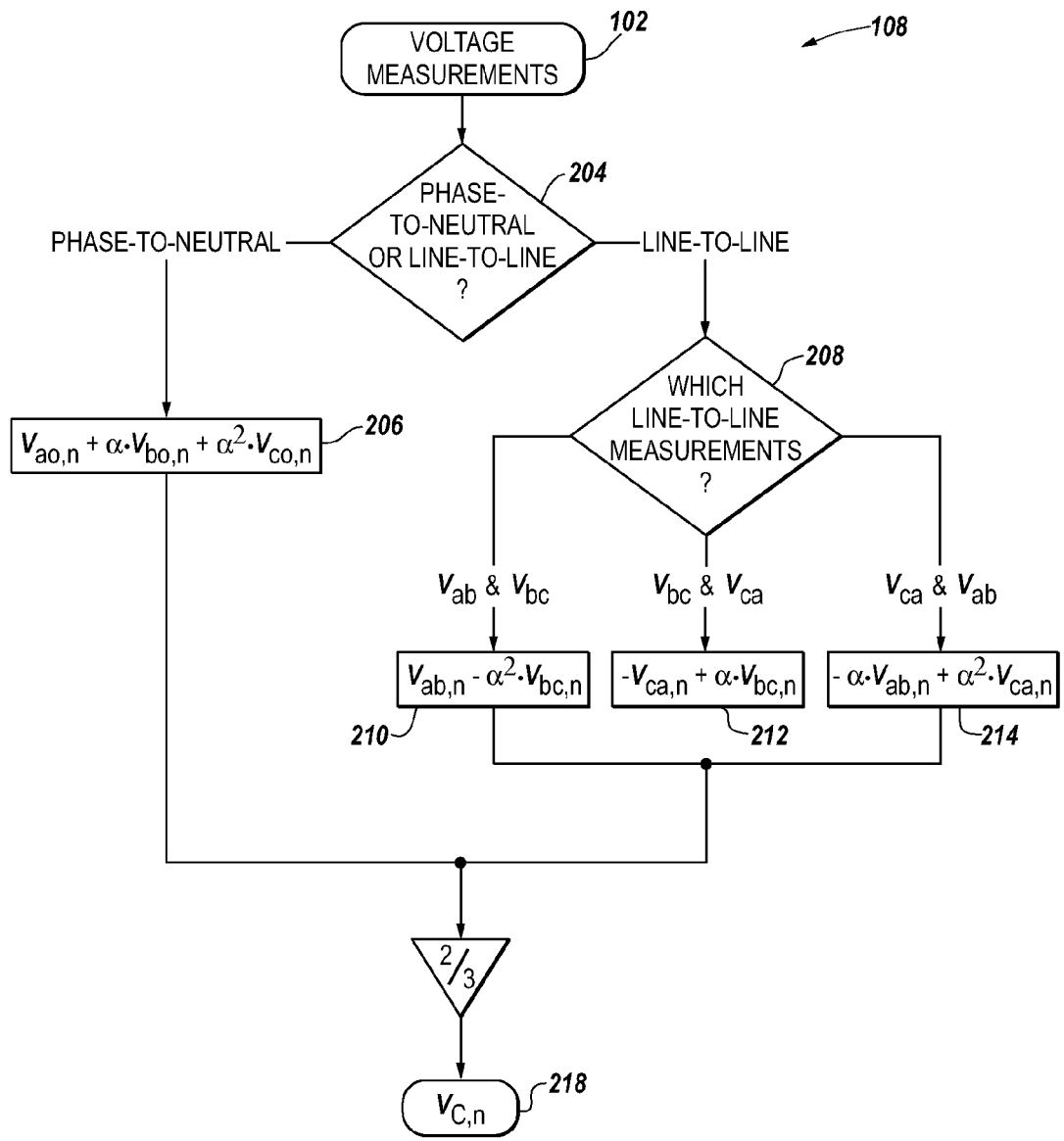

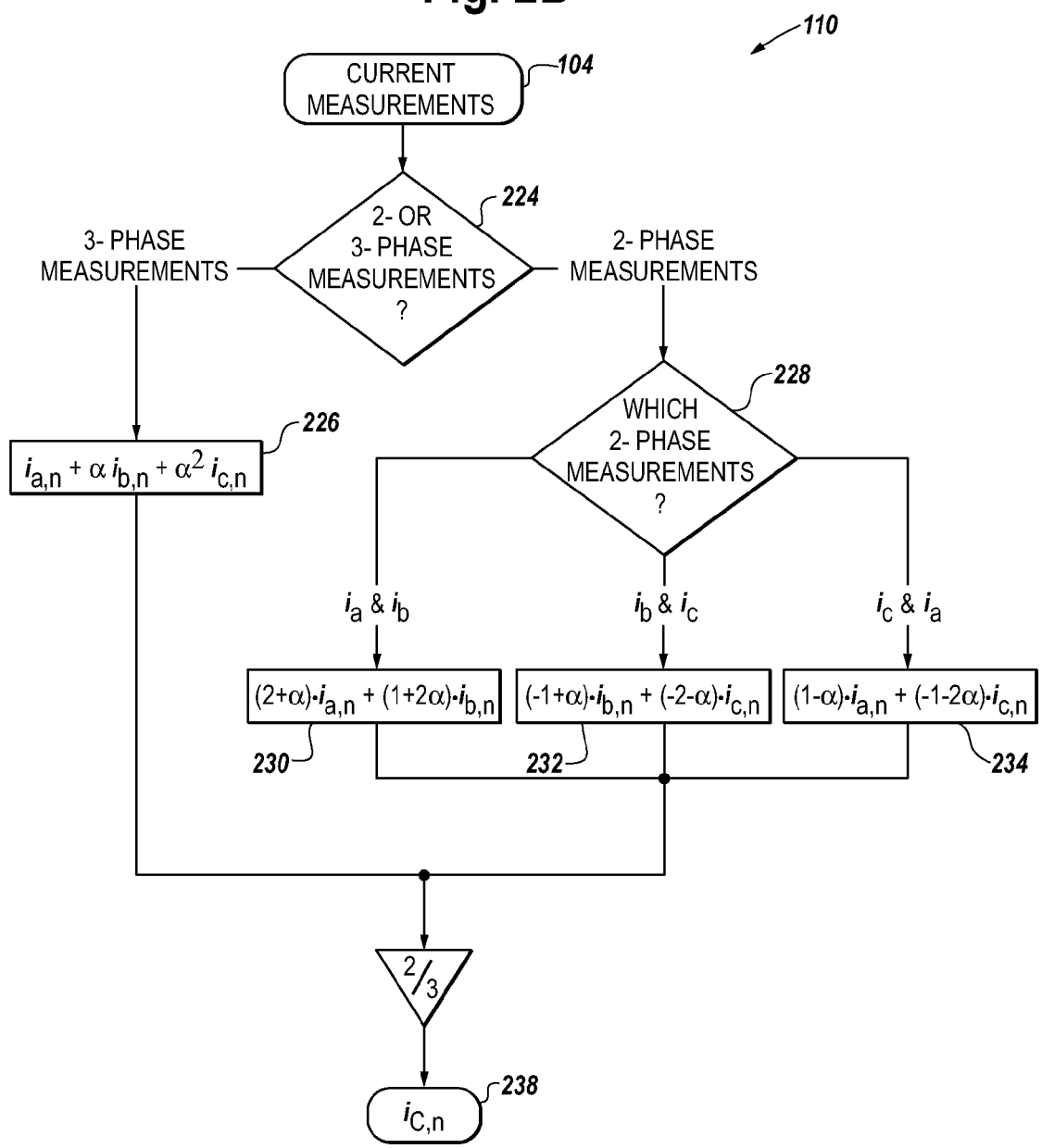

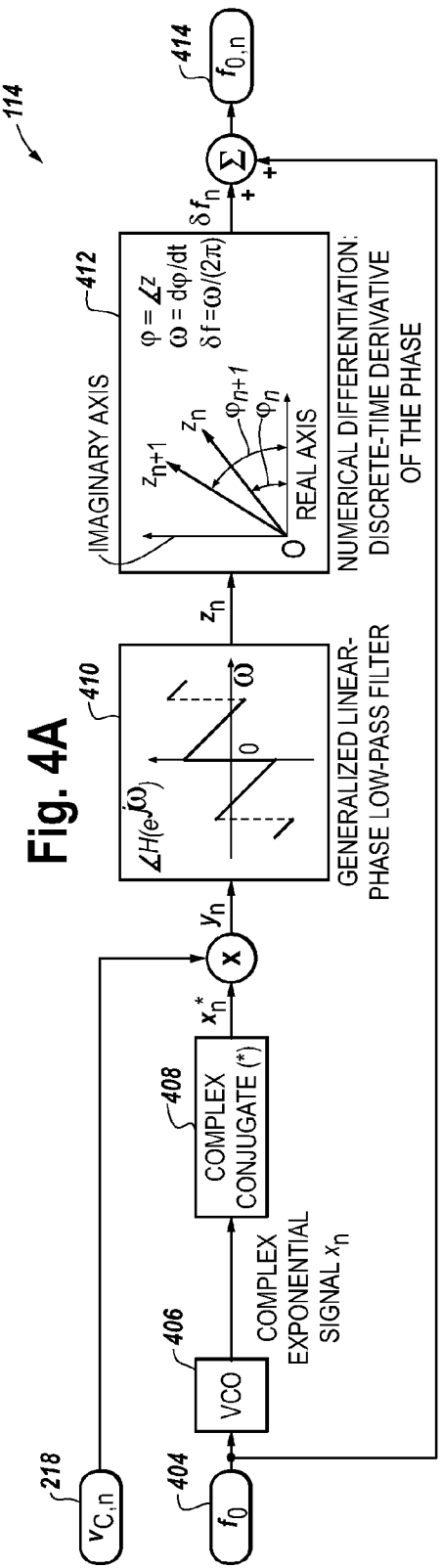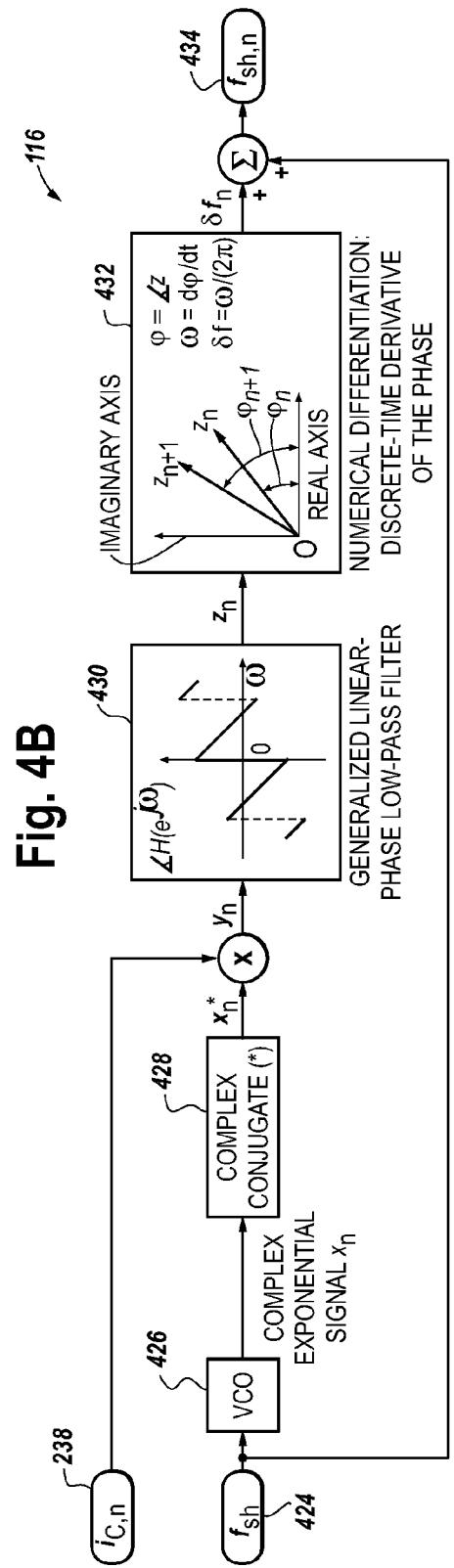

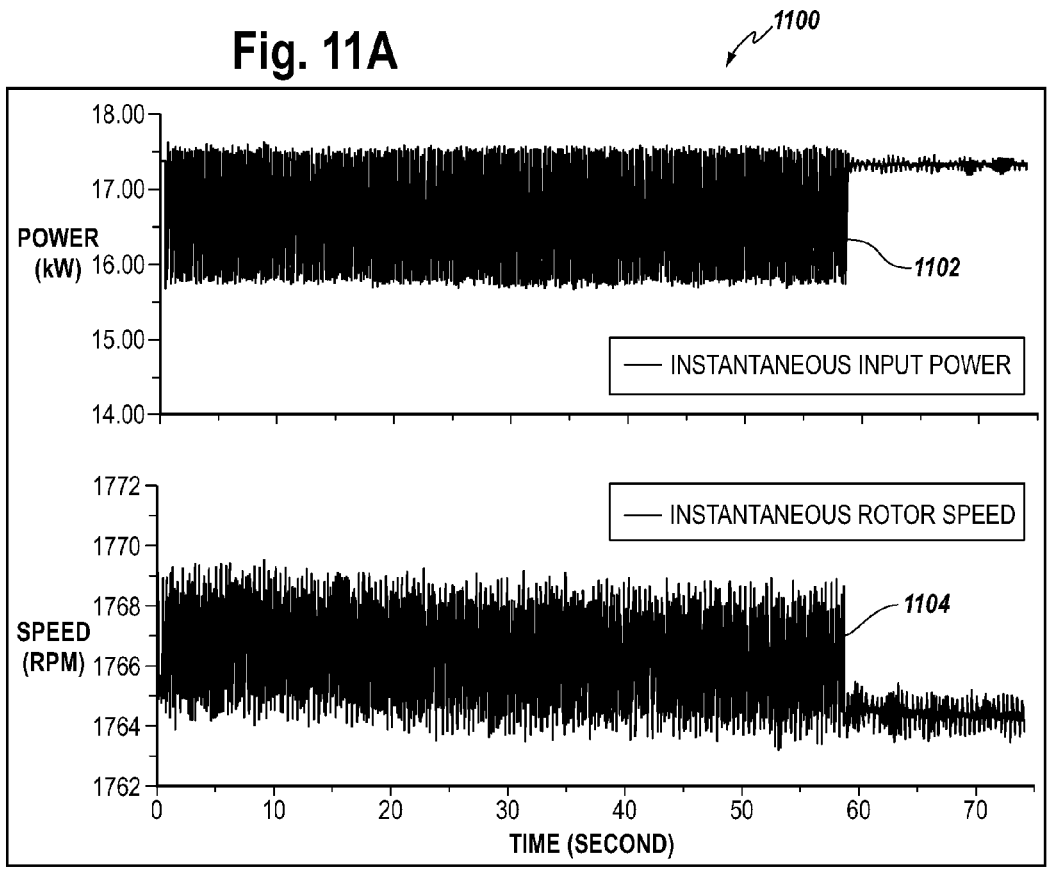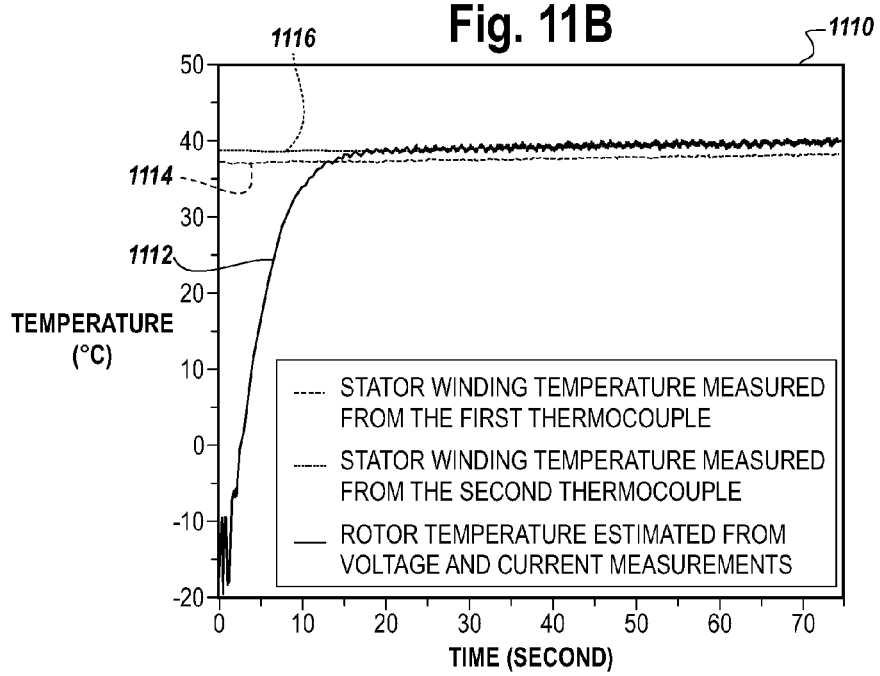

METHOD AND APPARATUS FOR ESTIMATING INDUCTION MOTOR ELECTRICAL PARAMETERS

CROSS-REFERENCE TO RELATED APPLICATION

This application claims the benefit of U.S. Provisional Application Ser. No. 61/053,941, filed May 16, 2008, entitled "Methods and Apparatuses for Estimating Transient Slip, Rotor Slots, Motor Parameters, and Induction Motor Temperature."

FIELD OF THE INVENTION

The present disclosure relates generally to the estimation of electrical parameters in induction motors without using actual speed sensors or any electronic injection circuits. More particularly, this disclosure relates to the estimation of electrical parameters from the motor nameplate data and voltage and current measurements, for line-connected induction motors operated at steady-state and/or dynamic conditions.

BACKGROUND

Squirrel-cage induction motors are widely used in industrial applications. Their electrical parameters often need to be estimated for high-performance motor drives using field oriented control. The estimated parameters can also provide indispensable information for the purpose of motor condition monitoring, diagnosis, and protection. For example, an accurate estimate of the rotor temperature in a model-reference adaptive system ("MRAS") requires precise knowledge of a motor's stator inductance and total leakage factor.

There are typically four major approaches to obtaining the induction motor electrical parameters. The first approach involves locked-rotor and no-load tests according to an IEEE standard test procedure for polyphase induction motors and generators. Such tests require interruption of normal motor operation. Therefore, it is often difficult, if not impossible, to apply these tests to motors that have already been installed. Consequently, various estimation methods have been proposed for in-service motors based on a steady-state induction motor equivalent circuit model. According to this model, these estimation methods collect voltage and current measurements from a line-connected motor operated at various load levels and use equations to calculate the induction motor electrical parameters without actually having to stop the motor. A ratio of the stator leakage inductance to the magnetizing inductance is assumed during calculations to simplify the estimation process.

The second approach is based on signal injection techniques and is often used for inverter-fed motors. By controlling the inverter switches, different voltage waveforms are generated and applied to the stator terminals. Induction motor electrical parameters, such as the stator and rotor resistances, as well as, the transient and magnetizing inductances, are then extracted from stator voltage and current measurements. Some signal injection techniques require the rotor to remain stationary during the commissioning process, while other injection methods do not have such a restriction.

Although reasonably accurate estimates of induction motor electrical parameters are usually obtainable using this approach, in practice, it is rather impractical to implement this approach for line-connected motors because separate electronic circuits are required to modify the stator voltage waveforms.

The third approach involves iterative tuning of induction motor electrical parameters to minimize certain error indices. However, while certain schemes in this approach are based on the steady-state induction motor equivalent circuit model, others still require spectrally rich excitation signals be injected into the motor. It is possible that they do not work well for line-connected motors under dynamic motor operations, such as the applications where motors are connected to time-varying loads of reciprocating compressors or pumps.

The fourth approach is based on a dynamic induction motor equivalent circuit model. This approach estimates the induction motor electrical parameters by computing a least-squares solution. This least-squares solution computation technique requires the knowledge of a rotor speed, usually obtained from a mechanical speed sensor attached to the shaft of a motor. However, because of the cost and fragile nature of such a speed sensor, and because of the difficulty of installing the sensor in many motor applications, speed-sensorless schemes based on induction motor magnetic saliency are preferred.

What is needed is a cost-effective induction motor condition monitoring, diagnosis, and protection system that can accurately and reliably determine induction motor electrical parameters from motor nameplate data plus voltage and current measurements. What is also needed is an induction motor condition monitoring, diagnosis, and protection system that is capable of producing such estimates during steady-state and/or dynamic conditions.

SUMMARY OF THE INVENTION

According to some aspects, a method and apparatus for estimating induction motor electrical parameters are provided. The estimations are determined based on motor nameplate data, as well as, voltage and current measurements acquired at motor control centers or at motor terminals. The induction motor stator resistance is calculated from the motor nameplate data. Other induction motor electrical parameters, such as stator inductance, total leakage factor, and rotor time constant, are estimated from measurements acquired during steady-state and/or dynamic motor operations. No additional sensors or injection circuits are needed. The method can be divided into four major components.

First, a complex voltage space vector is synthesized from voltage measurements. A complex current space vector is synthesized from current measurements. The voltage measurements can be either phase-to-neutral or line-to-line, and the current can be measured either from two phases or from all three phases.

Second, an instantaneous rotor speed can be detected by calculating a rotational speed of a single rotor slot harmonic component, which is extracted from the complex current space vector, with respect to the rotational speed of a fundamental frequency component, which is extracted from the complex voltage space vector. This rotor speed measurement/estimation eliminates the need for a speed measurement from a tachometer, which adds cost and bulk to the motor.

Third, a positive sequence fundamental frequency voltage component is obtained from the complex voltage vector. A positive sequence fundamental frequency current component is obtained from the complex current space vector. A computationally efficient discrete-time filtering technique can be used.

Fourth, induction motor electrical parameters can be determined according to a dynamic induction motor equivalent circuit model based on the motor nameplate data, as well as, the voltage and current measurements acquired at motor control centers or at motor terminals.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

FIG. 2A is a block diagram of a complex voltage space vector synthesis for use in the architecture of FIG. 1;

FIG. 2B is a block diagram showing a complex current space vector synthesis for use in the architecture of FIG. 1;

FIG. 4A is a block diagram illustrating methods of extracting a fundamental frequency from a complex voltage space vector according to some aspects;

FIG. 4B is a block diagram illustrating methods of extracting a rotor slot harmonic frequency from a complex current space vector according to some aspects;

FIG. 11A is a chart exemplifying a dynamic motor operation for a 20-hp 4-pole induction motor with 40 rotor slots according to some aspects;

FIG. 11B is a chart exemplifying an estimated rotor temperature and measured stator winding temperatures for a 20-hp 4-pole induction motor with 40 rotor slots during the dynamic motor operation in FIG. 11A;

DETAILED DESCRIPTION OF THE INVENTION

Although the invention will be described in connection with certain aspects and/or embodiments, it will be understood that the invention is not limited to those particular aspects and/or embodiments. On the contrary, the invention is intended to cover all alternatives, modifications, and equivalent arrangements as may be included within the spirit and scope of the invention as defined by the appended claims.

Figure 1:
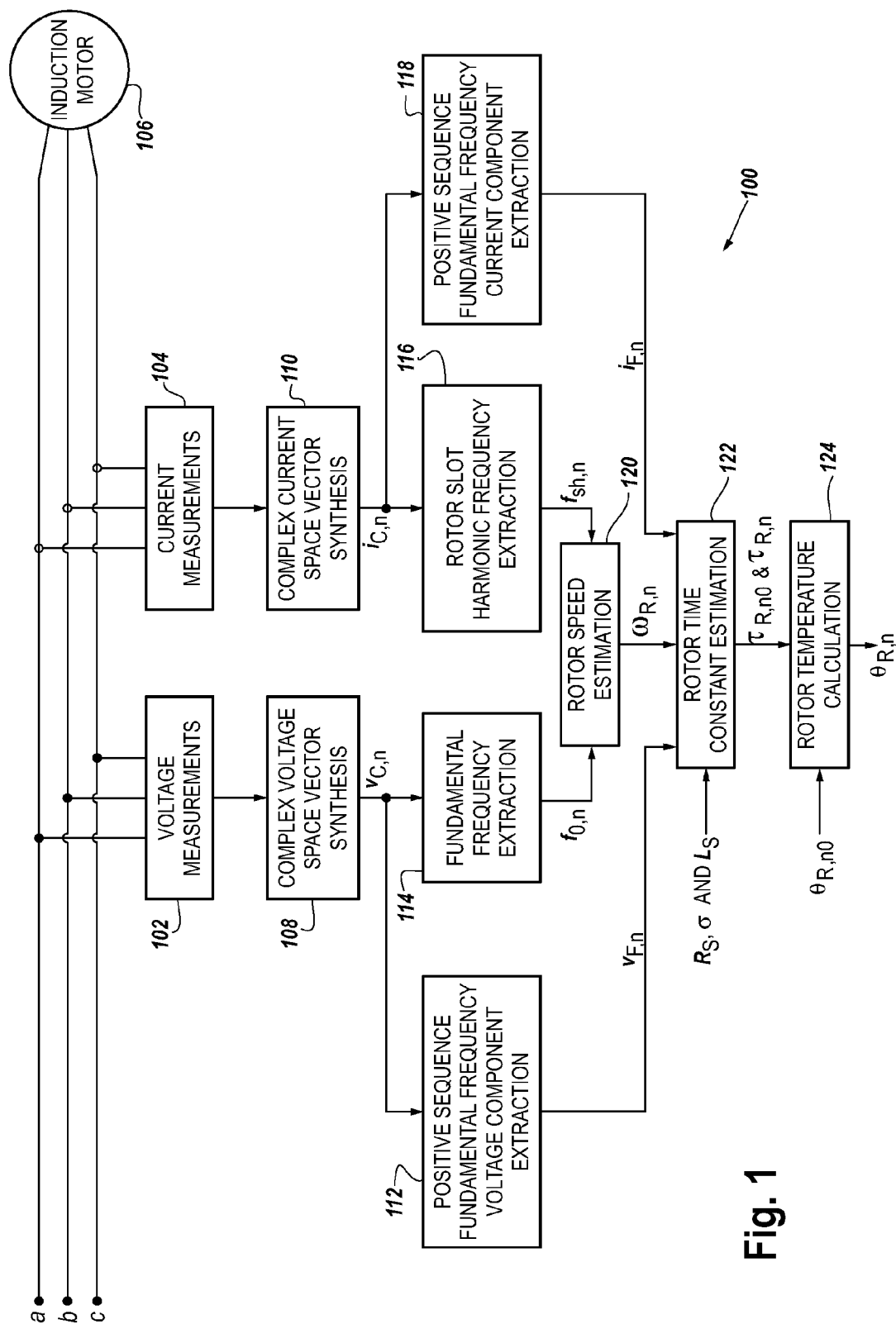
FIG. 1 is a block diagram illustrating an architecture of a method and apparatus for estimating an induction motor rotor temperature.

Referring to FIG. 1, an architecture (100) for estimating rotor temperature in an induction motor 106 is illustrated according to some aspects of the present concepts. The architecture (100) includes a complex voltage space vector synthesis (108), a complex current space vector synthesis (110), a rotor speed estimation (120), a positive sequence fundamental frequency voltage component extraction (112), a positive sequence fundamental frequency current component extraction (118), a rotor time constant estimation (122), and a rotor temperature calculation (124).

Complex Space Vector Synthesis 108, 110

According to some aspects, voltage measurements (102) and current measurements (104) can be acquired in the form of samples from phase a, b and c at a sampling frequency $f_s$ for a line-connected induction motor (e.g., an induction motor 106) having a floating neutral point. The complex space vector, $v_C$ or $i_C$, synthesized from voltage measurements (102) or current measurements (104), is a sequence of complex numbers carrying frequency information between $-f_s/2$ and $f_s/2$. The positive half of the complex space vector frequency spectrum corresponds to the positive sequence components at various frequencies, while the negative half corresponds to the negative sequence components at various frequencies.

Complex Voltage Space Vector Synthesis

FIG. 2A illustrates a block diagram of the complex voltage space vector synthesis (108) of FIG. 1. The complex voltage space vector, $v_{C,n}$, (218) is calculated from the voltage measurements (102) by Equation 1, $$v_{C,n} = 2/3 \cdot (v_{ao,n} + \alpha \cdot v_{bo,n} + \alpha^2 \cdot v_{co,n})$$ Equation 1 where $\alpha = e^{j2\pi/3}$; $v_{ao}$, $v_{bo}$, $v_{co}$ are the voltage difference between phase a, b and c and an arbitrary voltage reference point o selected by a measurement device, respectively; the subscript n denotes the nth instant (or sample) in a discrete-time system.

When phase-to-neutral voltage measurements are not available and only the line-to-line voltage measurements (208) are available, $v_{C,n}$ (218) can also be calculated from the line-to-line voltage measurements (210, 212, 214) using Equation 2, $$v_{C,n} = \tfrac{2}{3} \cdot (v_{ab,n} - \alpha^2 v_{bc,n}), \text{ when } v_{ab} \text{ and } v_{bc} \text{ are available;}$$

$$v_{C,n} = \tfrac{2}{3} \cdot (-v_{ca,n} + \alpha \cdot v_{bc,n}), \text{ when } v_{bc} \text{ and } v_{ca} \text{ are available;}$$

$$v_{C,n} = \tfrac{2}{3} \cdot (-\alpha v_{ab,n} + \alpha^2 v_{ca,n}), \text{ when } v_{ca} \text{ and } v_{ab} \text{ are available}$$

Equation 2 where $v_{ab}$ is the voltage difference between phase a and phase b, $v_{bc}$ is the voltage difference between phase b and phase c, $v_{ca}$ is the voltage difference between phase c and phase a.

Complex Current Space Vector Synthesis

FIG. 2B illustrates a block diagram of the complex current space vector synthesis (110). The complex current space vector, $i_{C,n}$ (238) is calculated from the current measurements (104) and Equation 3, $$i_{C,n} = \tfrac{2}{3} \cdot (i_{a,n} + \alpha \cdot i_{b,n} + \alpha^2 \cdot i_{c,n})$$

Equation 3 where $i_a$, $i_b$, $i_c$ are phase a, b and c current measurements, respectively.

When three phase measurements are not available and only current measurements from two phases are available, $i_{C,n}$ (238) can also be calculated from such current measurements. Specifically, depending on which two phase measurements (228) are available, Equation 4 specifies three alternatives (230, 232, and 234) for determining $i_{C,n}$.

$$i_{C,n} = \tfrac{2}{3} \cdot [(2+\alpha) \cdot i_{a,n} + (1+2\alpha) \cdot i_{b,n}], \text{ when } i_a \text{ and } i_b \text{ are available;}$$

$$i_{C,n} = \tfrac{2}{3} \cdot [(-1+\alpha) \cdot i_{b,n} + (-2-\alpha) \cdot i_{c,n}], \text{ when } i_b \text{ and } i_c \text{ are available;}$$

$$i_{C,n} = \tfrac{2}{3} \cdot [(1-\alpha) \cdot i_{a,n} + (-1-2\alpha) \cdot i_{c,n}], \text{ when } i_c \text{ and } i_a \text{ are available;}$$

Equation 4

Instantaneous Rotor Speed Detection

According to some aspects of the present disclosure, instantaneous rotor speed detection can include 3 subsystems: 1) fundamental frequency extraction (114) from the complex voltage space vector (218); 2) rotor slot harmonic frequency extraction (116) from the complex current space vector (238); and 3) rotor speed estimation (120). While the present disclosure illustrates examples relating to a particular instantaneous rotor speed detection scheme, other schemes are contemplated. For example, U.S. Provisional Application Ser. No. 61/053,941, filed May 16, 2008, entitled "Methods and Apparatuses for Estimating Transient Slip, Rotor Slots, Motor Parameters, and Induction Motor Temperature," which is incorporated by reference herein, provides additional examples of schemes that can be used in place of the scheme described herein for detecting the instantaneous rotor speed. Alternately, rotor speed can be determined conventionally via a speed sensing device coupled to a rotor of the induction motor 106.

Fundamental Frequency Extraction

For most motors (e.g., induction motor 106) connected directly to regulated power distribution networks, the motor's instantaneous fundamental frequency, $f_{0,n}$, typically varies within a small range around the rated fundamental frequency $f_0$. Because of this varying frequency, an accurate estimate of a particular motor's instantaneous rotor speed requires a reliable estimate of the instantaneous fundamental frequency.

For example, FIG. 4A illustrates a block diagram of the fundamental frequency extraction block 114 of FIG. 1, according to some aspects. A voltage controlled oscillator ("VCO") 406 generates a complex exponential signal $x_n$ in the demodulation and mixes the positive sequence fundamental frequency component in the complex voltage space vector down to a complex baseband. A generalized linear-phase low-pass filter 410 produces a complex baseband signal $z_n$ from a mixed complex voltage signal, $y_n$. A numerical differentiation block 412 extracts the discrete-time derivative of the phase from the complex baseband signal. The instantaneous fundamental frequency (414) can be calculated from the discrete-time derivative of the phase.

Voltage Controlled Oscillator

The VCO 406 reduces the complexity of the filter architecture in a subsequent stage. The VCO takes the rated fundamental frequency, $f_0$, (404) as its input and synthesizes the complex exponential signal, $x_n$, at sample n, as its output according to Equation 5:

$$x_n = \exp(j \cdot 2\pi n \cdot f_0 / f_s)$$

Equation 5 where j is the imaginary unit (e.g., $j^2 = -1$).

This synthesizing process is analogous to demodulating an FM signal. By multiplying the complex voltage space vector, $v_{C,n}$ (218) with the complex conjugate (408) of the VCO 406 output, $x_n^*$, the positive sequence fundamental frequency voltage component is mixed down to the complex baseband, where $y_n$ is the mixed complex voltage signal defined in Equation 6.

$$y_n = v_{C,n} \cdot x_n^*$$

Equation 6

Generalized Linear-Phase Low-Pass Filter

According to some aspects, the generalized linear-phase low-pass filter 410 takes the mixed complex voltage signal $y_n$ as its input and produces the complex baseband signal $z_n$ as its output. The generalized linear-phase low-pass filter 410 can provide linear phase response over a frequency band and suppress out-of-band interference from other sources. For example, if the complex baseband bandwidth is denoted as $\omega_B$, then signals between $-\omega_B$ and $\omega_B$ in $y_n$, including the signal at zero frequency, are retained. Signals beyond this frequency band $[-\omega_B\ \omega_B]$ are attenuated (e.g., filtered out). The generalized linear-phase low-pass filter 410 can preserve the shape of the mixed complex voltage signal, $y_n$. Specifically, the generalized linear-phase low-pass filter 410 introduces the same amount of time shift to the signals with frequencies between $-\omega_B$ and $\omega_B$. Using a generalized linear-phase low-pass filter (e.g., 410) ensures that phase information in the mixed complex voltage signal, $y_n$, is maintained without distortion. After filtering the mixed complex voltage signal, $y_n$, the numerical differentiation block 412 is applied to the complex baseband signal, $z_n$, to calculate the signal's angular rotational speed.

According to some aspects, discrete-time finite impulse response (FIR) filters can be used when implementing a generalized linear-phase low-pass filter (e.g., 410). Carefully designed infinite impulse response (IIR) Bessel filters can also be used with approximately linear phase within the $[-\omega_B\ \omega_B]$ range. Compared with their FIR counterparts, the IIR filters usually offer similar performance with smaller memory depth.

Commonly used filter design techniques, such as a Kaiser window design technique, offer useful solutions when selecting appropriate generalized linear-phase low-pass filters (e.g., generalized linear-phase low-pass filter 410). The desired cutoff frequency of the generalized linear-phase low-pass filter depends on the complex baseband bandwidth, $\omega_B$. For most line-connected motors in regulated power distribution networks, the frequency difference between the instantaneous fundamental frequency and the rated fundamental frequency is usually less than 1 Hz. Therefore, the cutoff frequency of a generalized linear-phase low-pass filter 410 is often chosen to be a few Hertz for the purpose of fundamental frequency extraction.

In some aspects, a time shift can be introduced by the generalized linear-phase low-pass filter 410, which can cause a delay between the filter input and output. Because the thermal time constant of a typical motor ranges from several minutes to an hour, this filter delay, usually a few seconds at most, can be regarded as negligible in final rotor temperature calculation (e.g., 124).

The start-up transient caused by a zero initial state in the generalized linear-phase low-pass filter 410 can be addressed by (1) determining the filter's initial state in advance, and/or (2) discarding the output that corresponds to the start-up transient. This start-up transient is typically negligibly short as compared to the motor's thermal dynamics, thus, discarding the first few seconds of the filter's output does not adversely affect final rotor temperature estimation results.

Numerical Differentiation Block

If $\phi$ is the phase of the complex baseband signal, $z_n$, produced by the generalized linear-phase low-pass filter (410), (e.g., $\phi = \angle z$), then the angular speed of the complex baseband signal, $\omega$ [electrical rad/s], is related to the continuous-time derivative of the phase $\phi$ via Equation 7.

$$\omega = d\phi/dt \quad \text{Equation 7}$$

Frequency deviation, $\delta f$, is defined as the difference between the instantaneous frequency and its prescribed nominal value. In the fundamental frequency extraction (114), this frequency deviation is related to the difference between the instantaneous fundamental frequency (414) and the rated fundamental frequency (404). The frequency deviation quantity is calculated from $\omega$ via Equation 8.

$$\delta f = \omega/(2\pi) \quad \text{Equation 8}$$

In a discrete-time system, the numerical differentiation block (412) approximates the continuous-time derivative of the phase given in Equations 7 and 8. If the sampling interval is denoted as $T_s$ ($T_s = 1/f_s$), three different formulas can be utilized to approximate the continuous-time derivative of the phase depending on the desired precision.

1) A forward difference formula provides:

$$\delta f_n = (\phi_{n+1} - \phi_n)/(2\pi T_s) = (\angle z_{n+1} - \angle z_n)/(2\pi \cdot T_s) \quad \text{Equation 9}$$

where the approximation error in $\delta f_n$ is proportional to $T_s$. A backward difference formula can be used in place of the forward difference formula to compute $\delta f_n$, which provides:

$$\delta f_n = (\phi_n - \phi_{n-1})/(2\pi T_s) = (\angle z_n - \angle z_{n-1})/(2\pi \cdot T_s) \quad \text{Equation 10}$$

where the approximation error in $\delta f_n$ is proportional to $T_s$.

2) A three-point formulas provides:

$$\delta f_n = (-3 \angle z_n + 4 \angle z_{n+1} - \angle z_{n+2})/(2\pi \cdot 2T_s) \quad \text{Equation 11a}$$

$$\delta f_n = (-\angle z_{n-1} + \angle z_{n+1})/(2\pi \cdot 2T_s) \quad \text{Equation 11b}$$

$$\delta f_n = (\angle z_{n-2} - 4 \angle z_{n-1} + 3 \angle z_n)/(2\pi \cdot 2T_s) \quad \text{Equation 11c}$$

where the approximation error in $\delta f_n$ is proportional to $T_s^2$.

For a sequence of complex numbers, Equation 11a is used to compute $\delta f$ for the first sample in this sequence, while Equation 11c is used to compute $\delta f$ for the last sample. For the rest samples in this sequence, Equation 11b is used to compute $\delta f$.

3) A five-point formulas provides:

$$\delta f_n = (-25 \angle z_n + 48 \angle z_{n+1} - 36 \angle z_{n+2} + 16 \angle z_{n+3} - 3 \angle z_{n+4})/(2\pi \cdot 2T_s) \quad \text{Equation 12a}$$

$$\delta f_n = (\angle z_{n-2} - 8 \angle z_{n-1} + 8 \angle z_{n+1} - \angle z_{n+2})/(2\pi \cdot 2T_s) \quad \text{Equation 12b}$$

$$\delta f_n = (3 \angle z_{n-4} - 16 \angle z_{n-3} + 36 \angle z_{n-2} - 48 \angle z_{n-1} + 25 \angle z_n)/(2\pi \cdot 2T_s) \quad \text{Equation 12c}$$

where the approximation error in $\delta f_n$ is proportional to $T_s^4$. For a sequence of complex numbers, Equation 12a determines $\delta f$ for the first two samples in this sequence, while Equation 12c determines $\delta f$ for the last two samples. For the rest samples in the sequence, Equation 12b determines $\delta f$.

According to some aspects of the present concepts, a discrete-time differentiator can be used as an alternative to the numerical differentiation block (412) discussed above. Such a discrete-time differentiator is often designed from a linear-phase system using a Kaiser window.

Instantaneous Fundamental Frequency Calculation

The instantaneous fundamental frequency, $f_{0,n}$ [Hz] (414), can be calculated by summing up the frequency deviation, output from the numerical differentiation block (412) with the rated fundamental frequency (404), as provided in Equation 13.

$$f_{0,n} = f_0 + \delta f_n \quad \text{Equation 13}$$

Dominant Rotor Slot Harmonic Frequency Extraction

For a squirrel-cage induction motor, a finite number of rotor slots produce steps in a waveform of rotor magnetomotive forces (MMFs) when excited by a positive sequence flux wave at a rated fundamental frequency from the stator. These steps in the rotor MMF affect the waveform of an air gap flux. In addition, the large reluctance of the rotor slot conductors and flux saturation due to high field concentration at the rotor slot openings produce spatial variations in, for example, an induction motor's air gap permeance. Because the air gap permeance interacts with the MMF from both the stator and the rotor to produce air gap flux, variations in the air gap permeance manifest themselves in the air gap flux. Furthermore, because the air gap flux is linked to stator windings, the variations in the air gap flux are reflected in a stator current harmonic spectrum.

A dominant rotor slot harmonic typically has the largest amplitude among all rotor slot harmonic components in the stator current harmonic spectrum. The dominant rotor slot harmonic frequency is related to the rotor design parameters via the relationship shown in Table I below:

TABLE I

Relationship between the Dominant Rotor Slot Harmonic Frequency and Rotor Design Parameters

| Case | h = $f_{sh}/f_0 |_{slip=0}$ | Condition |
| --- | --- | --- |
| 1 | (kR/P − 1) | kR/P − 1 = 6m + 1 |
| 2 | −(kR/P − 1) | kR/P − 1 = 6m − 1 |
| 3 | NONE | kR/P − 1 ≠ 6m ± 1 |
| 4 | (kR/P + 1) | kR/P + 1 = 6m + 1 |
| 5 | −(kR/P + 1) | kR/P + 1 = 6m − 1 |
| 6 | NONE | kR/P + 1 ≠ 6m ± 1 | where $f_{sh}$ [Hz] is the dominant rotor slot harmonic frequency; k=1, 2, 3, . . . , indicates the rotor MMF distribution harmonic order; m=1, 2, 3, . . . , is a positive integer; P is the number of pole-pairs; R is the number of rotor slots.

Figure 3A:
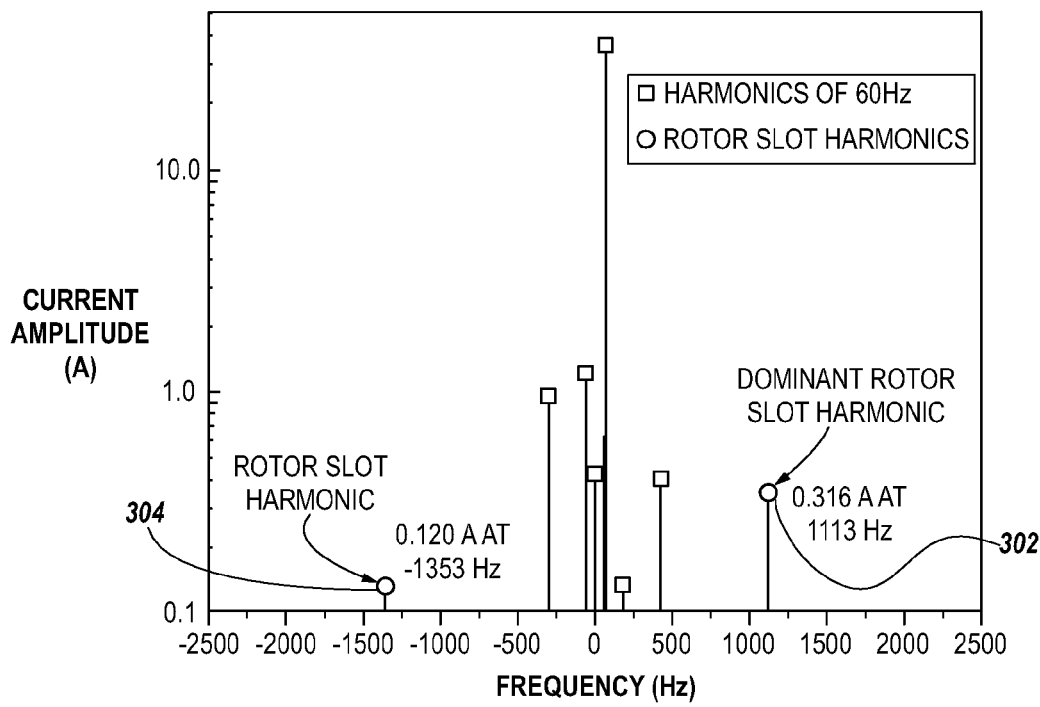
FIG. 3A is a chart exemplifying a stator current harmonic spectrum computed from a complex current space vector for a 20-hp 4-pole induction motor with 40 rotor slots according to some aspects.

For many motors, Table I provides guidelines on the relationship between the dominant rotor slot harmonic frequency and the rotor design parameters. For example, for a 20-hp 4-pole induction motor with R=40, the condition associated with Case 1 in Table I, kR/P−1=6m+1, is satisfied when k=1 and m=3. Therefore, the dominant rotor slot harmonic frequency lies at (kR/P−1)·$f_0$=19·$f_0$ when slip=0. FIG. 3A illustrates an exemplary stator current harmonic spectrum indicating that the motor's dominant rotor slot harmonic frequency (302) is 1113 Hz when the motor is connected to the power supply with a rated fundamental frequency of 60 Hz and operated at around rated load.

Figure 3B:
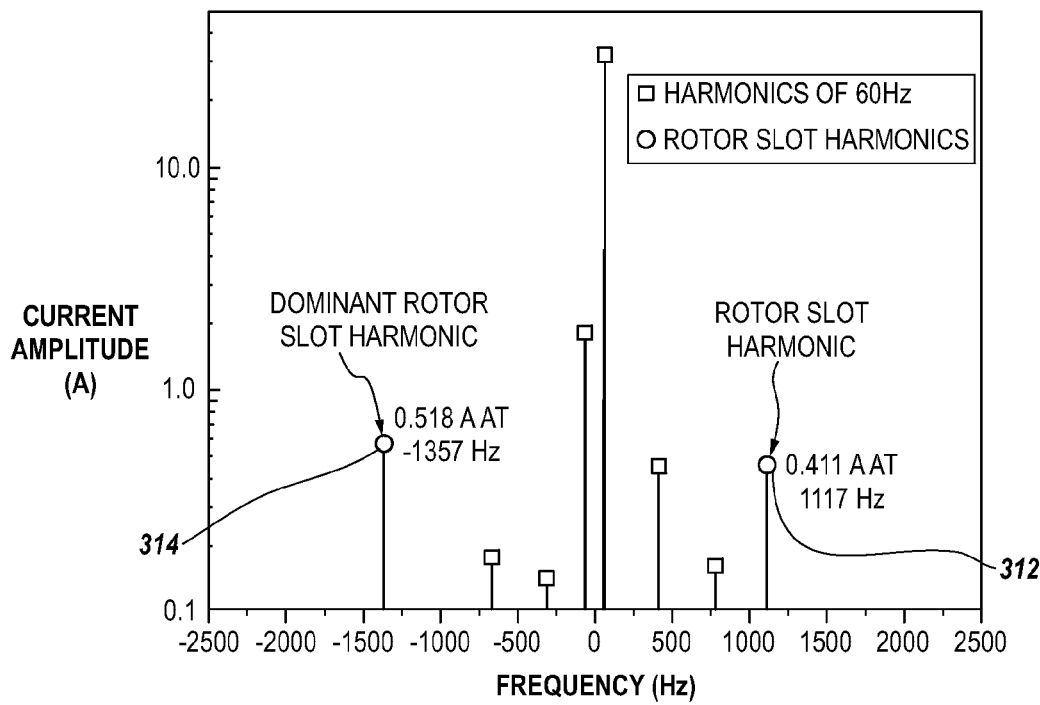
FIG. 3B is a chart exemplifying a stator current harmonic spectrum computed from a complex current space vector for a 7.5-hp 4-pole induction motor with 44 rotor slots according to some aspects.

By way of another example, a 7.5-hp 4-pole induction motor with R=44 (e.g., the condition associated with Case 5 in Table I), where kR/P+1=6m−1, satisfies the condition when k=1 and m=4. Therefore, the dominant rotor slot harmonic frequency lies at −(kR/P+1)·$f_0$=−23·$f_0$ when slip=0. FIG. 3B illustrates an exemplary stator current harmonic spectrum indicating that the motor's dominant rotor slot harmonic frequency (314) is −1357 Hz when the motor is connected to a power supply with a rated fundamental frequency of 60 Hz and operated at around rated load.

Figure 3C:
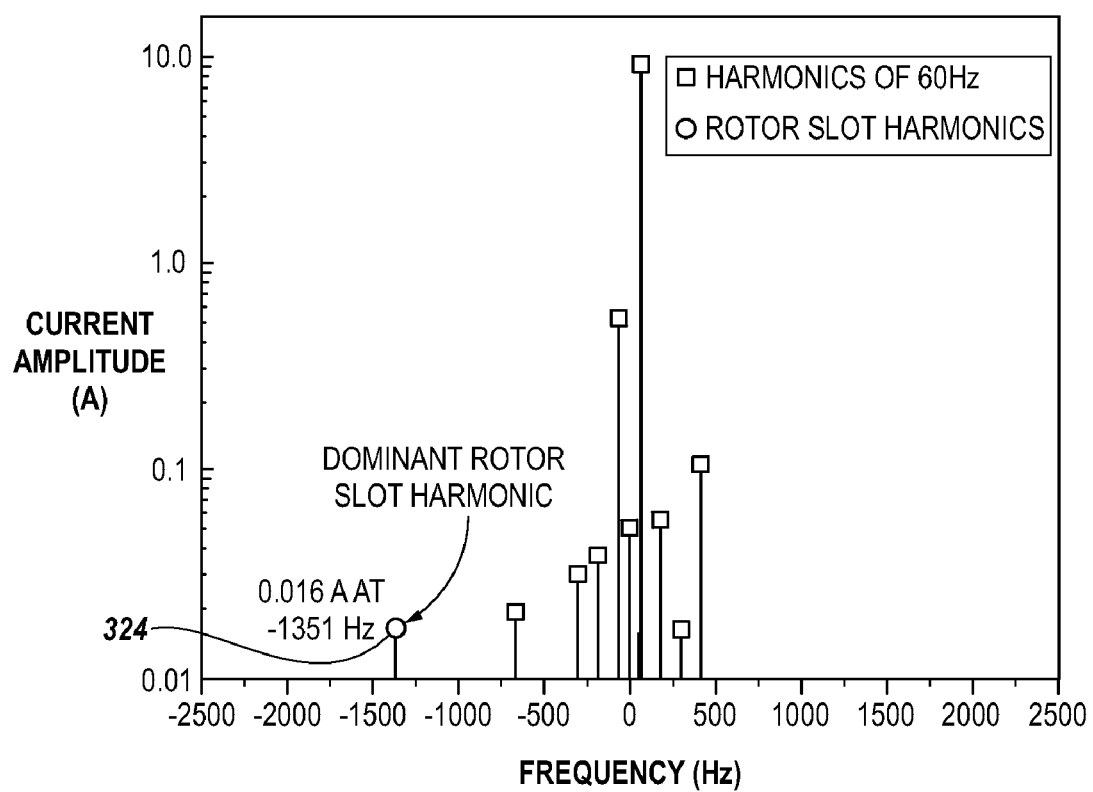
FIG. 3C is a chart exemplifying a stator current harmonic spectrum computed from a complex current space vector for a 2-hp 6-pole induction motor with 33 rotor slots according to some aspects.

By way of yet another example with a 2-hp 6-pole induction motor with R=33, (e.g., the condition associated with Case 5 in Table I), where kR/P+1=6m−1, the condition is satisfied when k=2 and m=4. Therefore, the dominant rotor slot harmonic frequency lies at −(kR/P+1)·$f_0$=−23·$f_0$ when slip=0. FIG. 3C illustrates an exemplary stator current harmonic spectrum indicating that the motor's dominant rotor slot harmonic frequency (324) is −1351 Hz when the motor is connected to a power supply with a rated fundamental frequency of 60 Hz and operated at around rated load.

FIG. 4B is a block diagram of the rotor slot harmonic frequency extraction (116) of FIG. 1. Similar to the fundamental frequency extraction (114) scheme described above, the rotor slot harmonic frequency extraction (116) scheme includes a VCO 426, a generalized linear-phase low-pass filter 430, a numerical differentiation block 432 and an instantaneous dominant rotor slot harmonic frequency calculation block 434.

Voltage Controlled Oscillator 426

In FIG. 4B, the Voltage Controlled Oscillator 426 takes a nominal dominant rotor slot harmonic frequency as its input and produces a complex exponential signal as its output. The nominal dominant rotor slot harmonic frequency, $f_{sh}$, (424) can be determined from a motor (e.g., induction motor 106) nameplate data plus rotor design parameters. The rotor design parameters can often be obtained from either the motor manufacturers or certain electric motor energy and management databases, such as the software tools provided by the U.S. Department of Energy. According to other aspects, the dominant rotor slot harmonic frequency can be determined by applying spectral estimation techniques to the stator current harmonic spectrum. A first approach relies on the knowledge of an approximate slip, usually derived from a linear relationship between the slip and the input power. A second approach typically requires steady-state motor operation during data acquisition.

Once the nominal dominant rotor slot harmonic frequency (424) is determined, the VCO 426 takes this nominal frequency (424) as its input and synthesizes a complex exponential signal, $x_n$, as its output, where $x_n$ is defined in Equation 14.

$$x_n = \exp(j \cdot 2\pi n \cdot f_{sh}/f_s) \qquad \text{Equation 14}$$

Multiplying the complex current space vector, $i_{C,n}$, (238) with the complex conjugate (428) of the VCO 426 output, $x_n^*$, mixes the dominant rotor slot harmonic down to a complex baseband.

Generalized Linear-Phase Low-Pass Filter

A filter with nonlinear phase can distort the shape of a signal, even when the filter's frequency-response magnitude is constant. Thus, according to some aspects, the generalized linear-phase low-pass filter 430 is used in the rotor slot harmonic frequency extraction (116). This filter 430 has a structure similar to its counterpart (e.g., filter 410) used in the fundamental frequency extraction (114). However, the cutoff frequency of the filter 430 can be chosen so that the filter 430 can pass a range of dominant rotor slot harmonic frequencies that corresponds to 50-150% of the motor's rated input power. The motor's (e.g., induction motor 106) rated input power is usually calculated from motor nameplate data, and the corresponding rotor slot harmonic frequencies can be approximated according to a linear relationship between the input power and the slip. For example, U.S. Provisional Application Ser. No. 61/053,941, filed May 16, 2008, entitled "Methods and Apparatuses for Estimating Transient Slip, Rotor Slots, Motor Parameters, and Induction Motor Temperature," which is incorporated by reference herein, provides examples for approximating the corresponding rotor slot harmonic frequencies. Thus, the generalized linear-phase low-pass filter 430 is designed along the same rules outlined above in reference to the generalized linear-phase low-pass filter 410 but with a different cutoff frequency.

Numerical Differentiation Block

The structure of the numerical differentiation block 432 used in the rotor slot harmonic frequency extraction (116) is identical to its counterpart (412) used in the fundamental frequency extraction (114).

Instantaneous Dominant Rotor Slot Harmonic Frequency Calculation

The instantaneous dominant rotor slot harmonic frequency, $f_{sh,n}$ [Hz], (434) is calculated by summing up frequency deviation and the nominal dominant rotor slot harmonic frequency (424) according to Equation 15.

$$f_{sh,n} = f_{sh} + \delta f_n \qquad \text{Equation 15}$$

Rotor Speed Estimation

Figure 5:
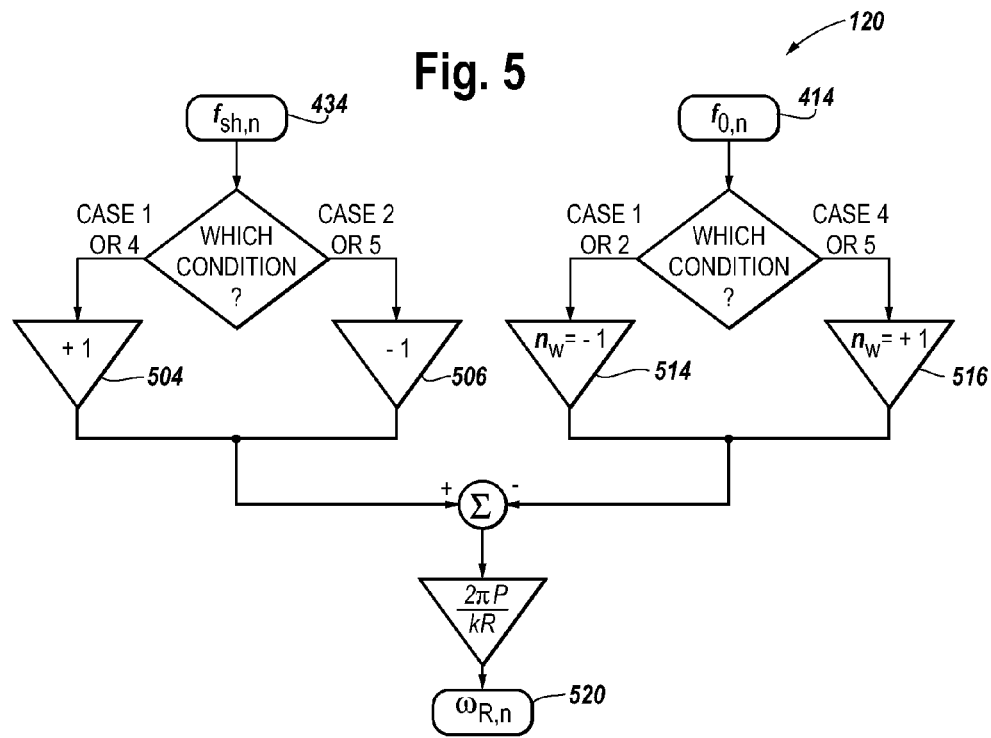
FIG. 5 is a block diagram illustrating methods of estimating an instantaneous rotor speed according to some aspects.

FIG. 5 is a block diagram of the rotor speed estimation (120). The rotor speed, $\omega_R$ [electrical rad/s], (520) can be calculated from the extracted instantaneous fundamental frequency (414) and the extracted instantaneous dominant rotor slot harmonic frequency (434) via Equation 16:

$$\omega_{R,n} = 2\pi P \cdot (\pm f_{sh,n} - n_w \cdot f_{0,n})/(kR) \qquad \text{Equation 16}$$

where '+' sign (504) corresponds to Cases 1 and 4 in Table I, and '−' sign (506) corresponds to Cases 2 and 5 in Table I. Furthermore, $n_w$ is the stator winding distribution harmonic order. Corresponding to Cases 1 and 2 in Table I, $n_w$=−1 (514). Corresponding to Cases 4 and 5 in Table I, $n_w$=+1 (516). For example, speed estimation for a motor with a stator current harmonic spectrum as illustrated in FIG. 3A, will use a '+' sign (504) and $n_w$=−1 (514) in Equation 16. For another example, rotor speed estimation for a motor with a stator current harmonic spectrum as illustrated in FIG. 3B or FIG. 3C, will use a '−' sign (506) and $n_w$=+1 (516) in Equation 16.

Figure 6:
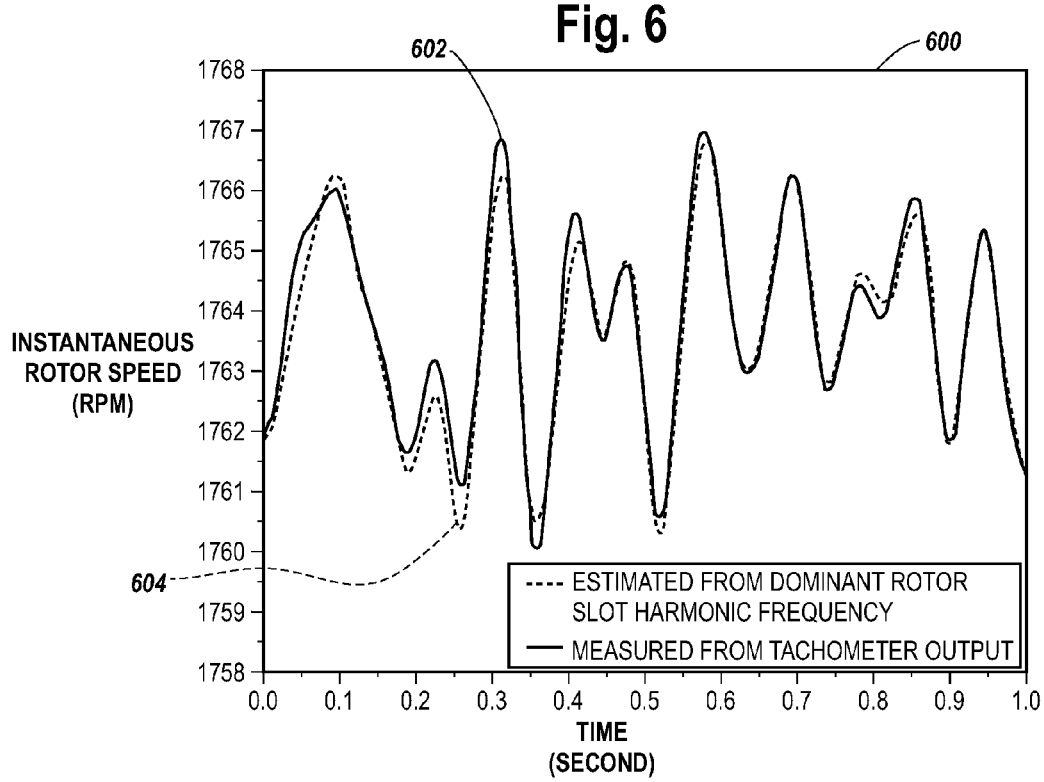
FIG. 6 is a chart exemplifying results of an instantaneous rotor speed detected from voltage and current measurements for a 20-hp 4-pole induction motor with 40 rotor slots during a dynamic motor operation with random load oscillation according to some aspects.

FIG. 6 is a chart 600 depicting an estimated instantaneous rotor speed (RPM) over time (604) from the voltage measurements (102) and current measurements (104) for a 20-hp 4-pole induction motor (e.g., induction motor 106) with 40 rotor slots, as outlined above. FIG. 6 compares the estimated instantaneous rotor speed with an instantaneous rotor speed detected from a speed sensing device, such as a tachometer mounted on the motor shaft to provide a voltage output that is proportional to the rotor speed. The tachometer output can be converted into rpm values and plotted over time (602), shown in FIG. 6, as a reference signal to compare and/or validate the rotor speed estimation (120) scheme outlined above.

While the instantaneous rotor speed, $\omega_{R,n}$, can be detected by applying the rotor slot harmonic frequency extraction (116) scheme to a dominant rotor slot harmonic described above, the present disclosure also contemplates other variations of determining the instantaneous rotor speed, $\omega_{R,n}$. For example, the instantaneous rotor speed, $\omega_{R,n}$, can also be detected by applying a slightly modified scheme to other non-dominant rotor slot harmonics (e.g., rotor slot harmonics 304 and 312 shown in FIGS. 3A and 3B). In these other schemes, a nominal rotor slot harmonic frequency (e.g., 304 and 312) that corresponds to the non-dominant rotor slot harmonic is inputted into a VCO, and the value of $n_w$ used in Equation 16 is an odd integer other than ±1.

Positive Sequence Fundamental Frequency Component Extraction

For the purpose of rotor time constant estimation (122), which occurs after the rotor speed estimation, the positive sequence fundamental frequency voltage and current components are typically extracted from the complex voltage and current space vectors, respectively.

Positive Sequence Fundamental Frequency Voltage Component Extraction

Figure 7A:
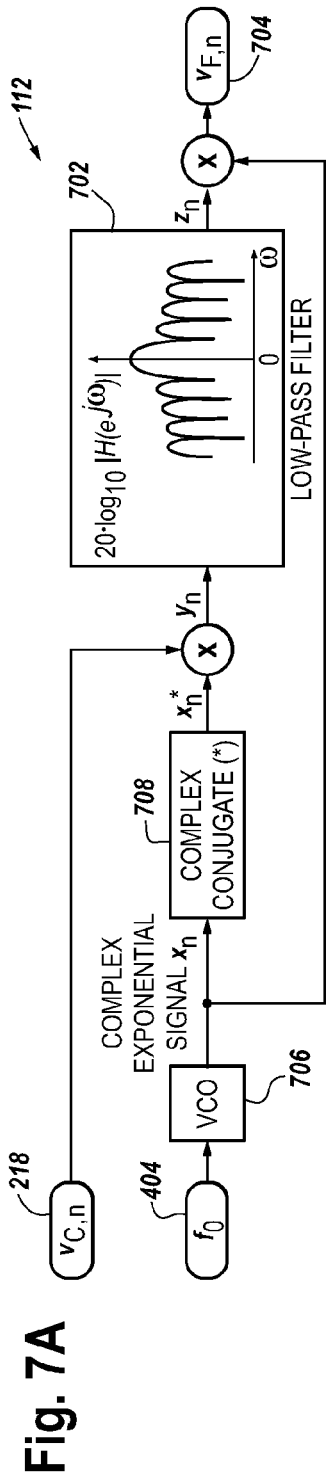
FIG. 7A is a block diagram illustrating methods of extracting a positive sequence fundamental frequency voltage component from a complex voltage space vector according to some aspects.

FIG. 7A is a block diagram of the positive sequence fundamental frequency voltage component extraction (112). It includes a VCO 706 and a discrete-time low-pass filter 702.

Voltage Controlled Oscillator

The VCO 706 used in the positive sequence fundamental frequency voltage component extraction (112) has a structure similar to the VCO 406. The complex conjugate (708) of the VCO output, $x_n^*$, is used in the demodulation to mix the positive sequence fundamental frequency voltage component in the complex voltage space vector (218) down to a complex baseband.

Low-Pass Filter

The low-pass filter 702 can be either a discrete-time FIR or a discrete-time IIR low-pass filter. The cutoff frequency of this low-pass filter 702 is usually chosen to accommodate the frequency deviation, allowed by power distribution network regulators, around the rated fundamental frequency $f_0$ (404). To simplify the implementation, the generalized linear-phase low-pass filter 410 used in the fundamental frequency extraction (114) can also be used.

Multiplying the low-pass filter output, $z_n$, with the VCO output, $x_n$, according to Equation 17, provides the positive sequence fundamental frequency voltage component, $v_{F,n}$, (704).

$$v_{F,n} = z_n \cdot x_n \qquad \text{Equation 17}$$

Positive Sequence Fundamental Frequency Current Component Extraction

Figure 7B:
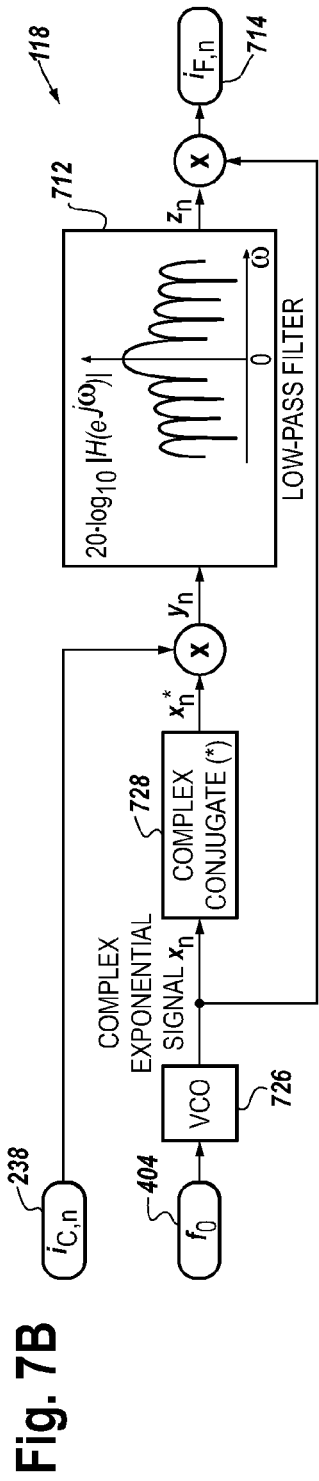
FIG. 7B is a block diagram illustrating methods of extracting a positive sequence fundamental frequency current component from a complex current space vector according to some aspects.

As shown in FIG. 7B, the positive sequence fundamental frequency current component extraction (118), of FIG. 1, has a structure that resembles the positive sequence fundamental frequency voltage component extraction (112). Similarly, the structure includes a rated fundamental frequency $f_0$ (404) input, a VCO 726, a complex conjugate block (728), and a low-pass filter 712. The positive sequence fundamental frequency current component extraction (118) takes the complex current space vector, $i_{C,n}$, (238) as an input, and produces the positive sequence fundamental frequency current component, $i_{F,n}$, (714) as its output. In addition, the cutoff frequency of the low-pass filter 712 should be high enough to retain the variations in the load-dependent positive sequence fundamental frequency current component. For example, if a motor experiences a 5 Hz load oscillation when connected to, for example, a reciprocating compressor, then the low-pass filter cutoff frequency can be chosen to be a few Hertz higher than this load oscillation frequency to accommodate the load-dependent positive sequence fundamental frequency current component.

Rotor Time Constant Estimation

Figure 9:
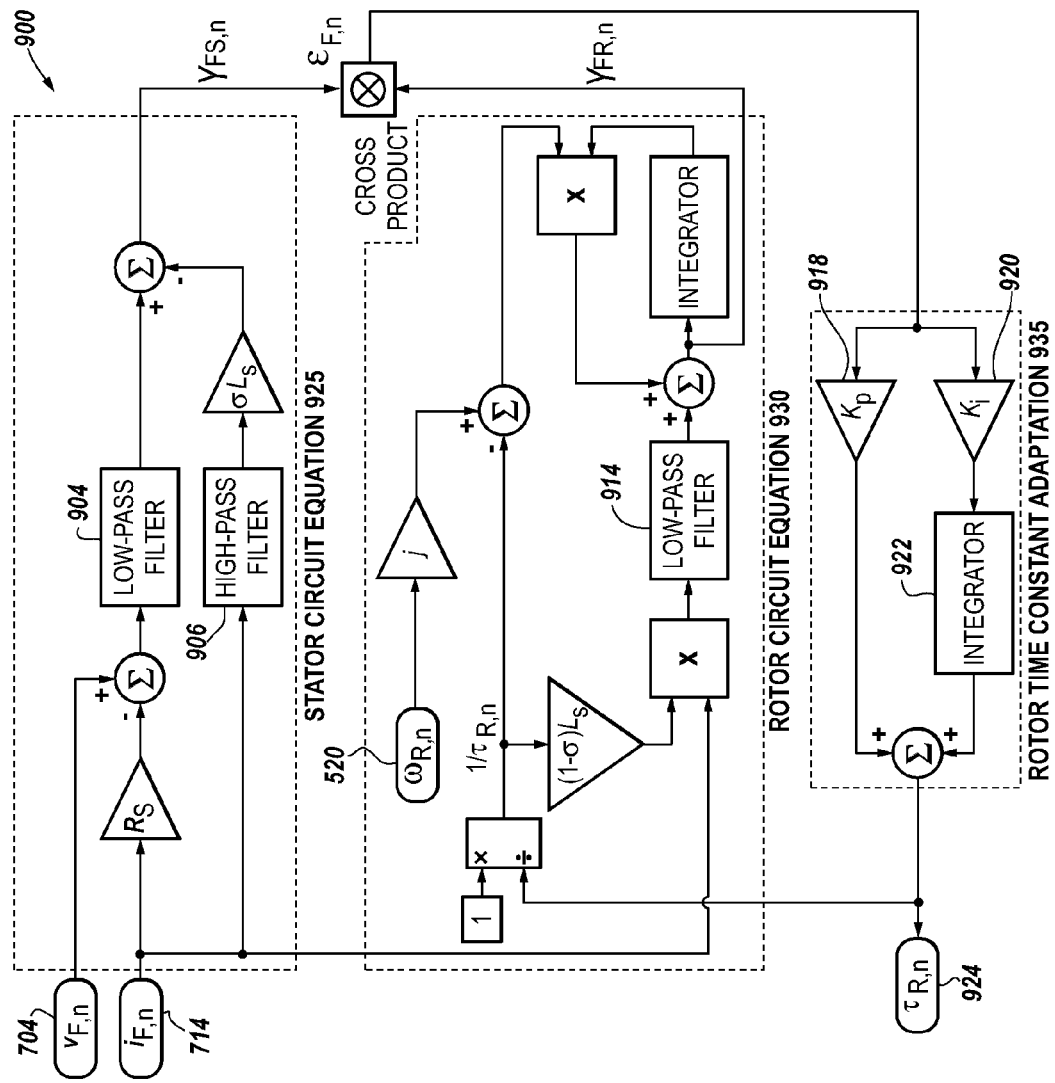
FIG. 9 is a block diagram illustrating methods of estimating a rotor time constant according to some aspects.

A rotor time constant (e.g., 924) can be estimated from a model-reference adaptive system, such as model-reference adaptive system 900 ("MRAS") shown in FIG. 9. The MRAS 900 can be configured to adjust the rotor time constant (924) to align a flux-related vector calculated from a rotor circuit equation (930) with another flux-related vector calculated from a stator circuit equation (925).

Stator and Rotor Circuit Equations

Figure 8:
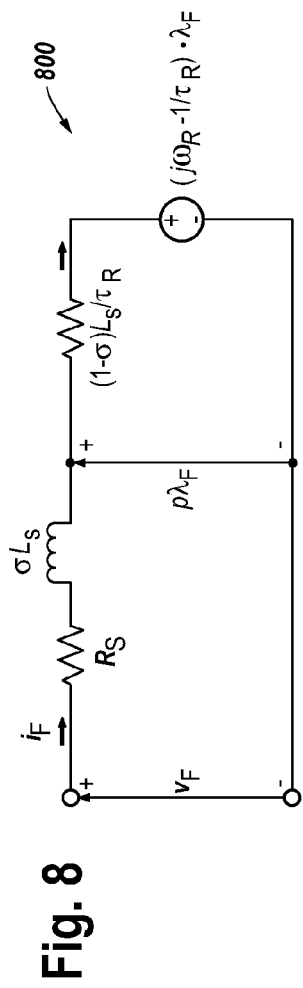
FIG. 8 is a schematic of a dynamic induction motor equivalent circuit model that characterizes the motor's stator and rotor circuit equations.

FIG. 8 illustrates a dynamic induction motor equivalent circuit (e.g., 800) in a stationary reference frame.

According to FIG. 8, the stator circuit Equation 18 is:

$$p\lambda_F = (v_F - R_S \cdot i_F) - \sigma L_S p i_F \qquad \text{Equation 18}$$

where the operator p represents the continuous-time derivative operator d/dt; $\lambda_F$ is a complex flux space vector; $R_S$ is stator resistance; $\sigma$ is total leakage factor; $L_S$ is stator inductance.

According to FIG. 8, the rotor circuit Equation 19 is:

$$p\lambda_F = [(1-\sigma)L_S/\tau_R] \cdot i_F + (j\omega_R - 1/\tau_R) \cdot \lambda_F \qquad \text{Equation 19}$$

where $\tau_R$ is the rotor time constant. It is defined as the ratio between rotor inductance, $L_R$, and rotor resistance, $R_R$, i.e., $\tau_R = L_R/R_R$. Instantaneous rotor speed is $\omega_R$ [rad/s]. The imaginary unit j rotates the complex quantities counter-clockwise by $\pi/2$.

The total leakage factor, $\sigma$, and the stator inductance, $L_S$, can be obtained from either motor manufacturer or standard no load and locked rotor tests according to the IEEE Standard 112 entitled "Standard Test Procedure for Polyphase Induction Motors and Generators". In case the information from neither channel is available, the inductances are estimated according to the method outlined in the section entitled "Induction Motor Electrical Parameter Estimation."

High-Pass Filter

Incorrect initial values produce dc offset errors in the flux vectors when computed according to Equations 18 and 19. One or more high-pass filters (e.g., a high-pass filter 906) can be used in the MRAS 900 to remove such errors by filtering the outputs of both the stator and rotor circuit equations (925 and 930). Substituting the expression $p\lambda_F$ with $(p+\omega_c)\gamma_F$, where $\omega_c$ is the high-pass filter cutoff frequency, and $\gamma_F$ is an auxiliary vector denoting the frequency contents in $\lambda_F$ that are above the high-pass filter cutoff frequency, transforms the Equations 18 and 19 to Equations 20 and 21, respectively, $$\gamma_{FS} = (v_F - R_S \cdot i_F)/(p+\omega_c) - \sigma L_S p i_F/(p+\omega_c) \qquad \text{Equation 20}$$

$$\gamma_{FR} = [(1-\sigma)L_S/\tau_R] \cdot i_F/(p+\omega_c) + (j\omega_R - 1/\tau_R) \cdot \gamma_{FR}/p \qquad \text{Equation 21}$$

where the expression, $\gamma_{FS}$, is a flux-related vector calculated from the stator circuit equation (925) according to Equation 20; and the expression, $\gamma_{FR}$, is a flux-related vector calculated from the rotor circuit equation (930) according to Equation 21. High-pass filter (906) has a form of $p/(p+\omega_c)$, and low-pass filters 904, 914 are in the form of $1/(p+\omega_c)$. Additionally, according to some aspects, both the high-pass filter and the low-pass filters have the same cutoff frequency.

Rotor Time Constant Adaptation

The MRAS 900 adapts the rotor time constant based on the magnitude of the cross product between $\gamma_{FS}$ and $\gamma_{FR}$, as shown in Equation 22:

$$\epsilon_F = \gamma_{FS} \times \gamma_{FR} = \text{real}(\gamma_{FS}) \cdot \text{imag}(\gamma_{FR}) - \text{imag}(\gamma_{FS}) \cdot \text{real}(\gamma_{FR}) \quad \text{Equation 22}$$

where $\epsilon_F$ denotes the magnitude of the cross product; the symbol × denotes the cross product operation; real(·) denotes the real part of a complex quantity; and imag(·) denotes the imaginary part of a complex quantity. Rotor time constant adaptation (935) uses $\gamma_{FS}$ from the stator circuit equation (925) as a reference vector and adjusts the rotor time constant, $\tau_R$, so that $\epsilon_F$ approaches 0. This indicates that the flux-related vector, $\gamma_{FR}$, is aligned with the reference vector $\gamma_{FS}$. As shown in FIG. 9, a proportional-integral block is used in the rotor time constant adaptation (935) to correlate $\epsilon_F$ to $\tau_R$ using Equation 23:

$$\tau_R = (K_p + K_i/S) \cdot \epsilon_F \quad \text{Equation 23}$$

where 1/s denotes an integrator (922).

The tuning of $K_p$ (918) and $K_i$ (920) values depends on knowledge of induction motor electrical parameters, as well as a motor's operating condition. According to some aspects, commonly used methods for tuning proportional-integral controllers in feedback control systems, such as the trial and error method or the Ziegler-Nichols method, provide a good starting point for fine-tuning. For most line-connected induction motor applications, small positive values of $K_p$ (918) and $K_i$ (920) suffice. Large positive values of $K_p$ (918) and $K_i$ (920) can decrease the rise time and increase the overshoot, but they can also introduce instability when tuned improperly.

According to some aspects of the present concepts, a positive value, typically between 0.1 and 1 second, is set as the initial value of $\tau_R$ before the adaptation (935) is started. Such a practice avoids the "division by zero" error arising from the implementation of $1/\tau_R$ and the subsequent instability in MRAS operation.

For most line-connected induction motors, thermal behavior is characterized by a slow thermal process with a large thermal time constant. Therefore, when tuned according to the tuning methods discussed above, the response time of the MRAS 900 is much smaller than the motor's thermal time constant. As a result, the MRAS output is regarded as the real-time value of the rotor time constant (924).

Rotor Temperature Calculation

According to some aspects of the present disclosure, a rotor temperature calculation can be based on an inverse relationship between a rotor temperature and the estimated rotor time constant (924), determined in block (122) of FIG. 1. This relationship is derived from a linear relationship between the rotor temperature and a rotor resistance.

Although rotor resistance is a function of both rotor temperature and slip frequency, the slip frequency of a line-connected induction motor (e.g., induction motor 106) only varies within a small range during normal motor operation. In addition, deep rotor bars or double cage rotors are rarely used in such motors. Therefore, the skin effect of the rotor resistance is not pronounced. Given that the rotor resistance is either independent of the slip, or properly compensated for based on known slip-resistance characteristics, the change in the rotor resistance is caused primarily by the change in the rotor temperature.

Assuming at time $n_0$, that the rotor resistance is $R_{R,n0}$, and the corresponding rotor temperature is $\theta_{R,n0}$ [° C.]; and at time n, the rotor resistance is $R_{R,n}$, and the corresponding rotor temperature is $\theta_{R,n}$, then the relationship between the rotor resistance and the rotor temperature can be defined as in Equation 24:

$$R_{R,n}/R_{R,n0} = (\theta_{R,n} + k)/(\theta_{R,n0} + k) \quad \text{Equation 24}$$

where k is a temperature coefficient related to the inferred temperature for zero resistance. According to some aspects, a temperature coefficient k is 234.5 for motors having 100% International Annealed Copper Standard conductivity copper. According to other aspects, a temperature coefficient k is 225 for motors having aluminum with a volume conductivity of 62%. It is contemplated that other suitable values of k are used for other motor materials.

The baseline rotor temperature, $\theta_{R,n0}$, can be either specified by the user, or determined from the motor's ambient temperature, a motor's ambient temperature is often a known quantity. Because thermal processes are usually slow, according to some aspects, this ambient temperature is taken as the baseline rotor temperature, $\theta_{R,n0}$, during the first several seconds after the motor is energized from a cold state. The baseline rotor time constant, $\tau_{R,n0}$, can be obtained from any of the following method 1) user input; 2) $\tau_{R,0}$ according to the method described in "Induction Motor Electrical Parameter Estimation" described below. 3) use the averaged rotor time constant produced by the rotor time constant estimation (122) during the first several seconds after the motor is energized and the rotor time constant estimation (122) produces stabilized outputs. This rotor time constant and temperature pair, $(\tau_{R,n0}, \theta_{R,n0})$, provides baseline information for the subsequent calculation of the rotor temperature at time n.

According to some aspects, a comparison of the rotor time constant, $\tau_{R,n}$ (924) at time n, which is obtained at the same motor load level, with the baseline rotor time constant, $\tau_{R,n0}$, at time $n_0$, yields the rotor temperature $\theta_{R,n}$, at time n, which is defined in Equation 25.

$$\theta_{R,n} = (\theta_{R,n0} + k) \cdot \tau_{R,n0}/\tau_{R,n} - k \quad \text{Equation 25}$$

Figure 10:
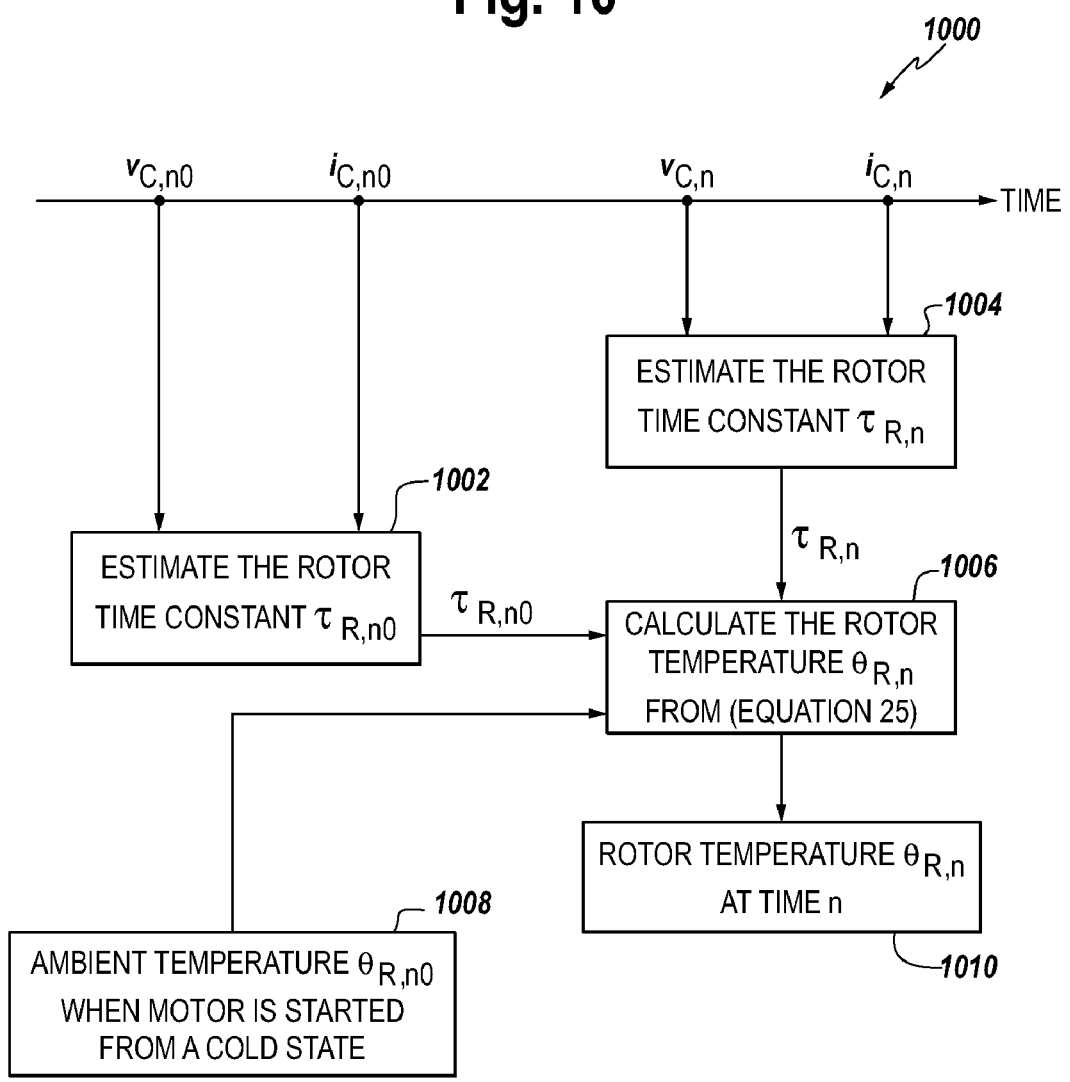
FIG. 10 is a block diagram illustrating methods of calculating a rotor temperature according to some aspects.

For example, FIG. 10 illustrates a flowchart (1000) of a rotor temperature calculation. Assuming that the ambient temperature is used as the baseline rotor temperature $\theta_{R,n0}$, and that $\tau_{R,n0}$ is obtained using the third method outlined above. Each time a new rotor time constant value, $\tau_{R,n}$, is calculated from current and voltage measurements along the lines outlined above, it is compared with the baseline value, $\tau_{R,n0}$, and the corresponding new rotor temperature, $\theta_{R,n}$, is computed using Equation 25 (1006).

FIG. 11A illustrates an exemplary chart 1100 of a dynamic motor's operation (i.e., power and speed) during an experiment using a 20-hp 4-pole induction motor with 40 rotor slots. During the experiment, a dc dynamometer can be used as a load. Additionally, a 5 Hz oscillation can be superimposed on the rated load of the motor to emulate, for example, a reciprocating compressor load. The amplitude of the oscillating load can be set to approximately 5% of the motor's rated load. After about 58 seconds, the oscillating load is disconnected and the motor continues to operate at the rated load until the end of the experiment. The upper plot of FIG. 11A illustrates the instantaneous input power over time (1102) calculated from the motor terminal voltage and current measurements (e.g., 102 and 104), and the lower plot illustrates the instantaneous rotor speed over time (1104), which is estimated from the voltage and current measurements (e.g., 102 and 104) as described above.

FIG. 11B depicts graphical results (1110) of calculating a rotor temperature. According to some aspects, the estimated rotor temperature for the tested a 20-hp 4-pole induction motor with 40 rotor slots is calculated in accordance with the present disclosure, and the calculated rotor temperature is plotted over time (1112). Additionally, rotor temperatures are measured from two J-type thermocouples that are instrumented in the stator windings, and the temperature readings from those thermocouples are also plotted over time (1114 and 1116) in the same figure for comparison purposes. As illustrated in FIG. 1B, the estimated rotor temperature (1112) converges to the temperatures measured by the two thermocouples after about 20 seconds of rotor time constant adaptation. Thus, the estimated rotor temperature outputted from, for example, rotor temperature calculation block (124) tracks the temperature measured by the two thermocouples continuously and accurately using the voltage and current measurements (e.g., 102 and 104) sampled from, for example, the induction motor 106 of FIG. 1.

Figure 12:
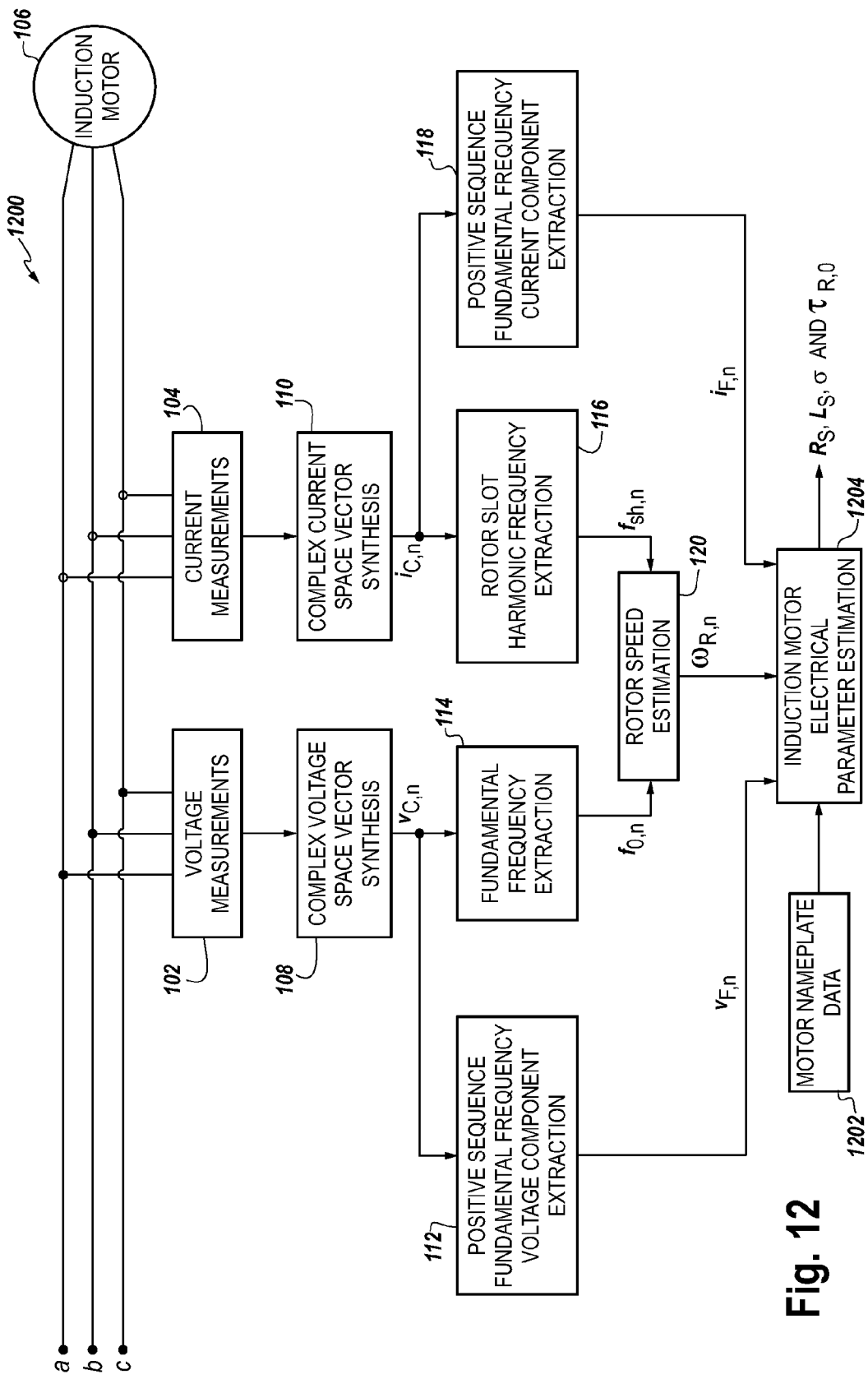
FIG. 12 is a block diagram showing an architecture of a method and apparatus for estimating induction motor electrical parameters without speed sensors according to some aspects of the present concepts.

Referring to FIG. 12, an architecture 1200 for estimating electrical parameters of an induction motor 106 is illustrated according to some aspects of the present disclosure. The architecture 1200 includes a complex voltage space vector synthesis block 108, a complex current space vector synthesis block 110, a rotor speed estimation block 120, a positive sequence fundamental frequency voltage component extraction block 112, a positive sequence fundamental frequency current component extraction block 118, and an induction motor electrical parameter estimation block 1204.

Induction Motor Electrical Parameter Estimation

According to some aspects, induction motor electrical parameters can be determined from the motor nameplate data, as well as voltage and current measurements (e.g., 102 and 104) acquired at motor control centers and/or at motor terminals. According to some aspects, an induction motor electrical parameter estimation algorithm can be formulated from a dynamic induction motor equivalent circuit model.

Figure 13:
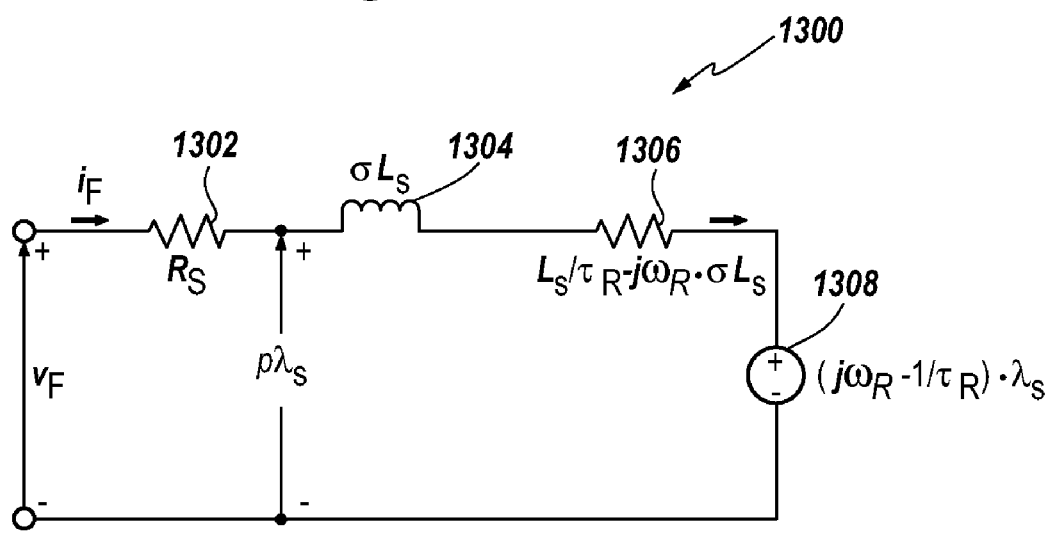
FIG. 13 is a schematic showing a dynamic induction motor equivalent circuit model that characterizes the motor's stator and rotor circuit equations according to some aspects.

For example, FIG. 13 depicts a dynamic induction motor equivalent circuit model 1300 in a stationary reference frame. The complex stator flux linkage, $\lambda_S$, is related to the positive sequence fundamental frequency voltage component, $v_F$, and the positive sequence fundamental frequency current component, $i_F$, as defined in Equation 26:

$$p\lambda_S = v_F - R_S \cdot i_F \qquad \text{Equation 26}$$

where p represents the continuous-time derivative operator d/dt; and $R_S$ is the stator resistance. The complex stator flux linkage, $\lambda_S$, is also related to the instantaneous rotor speed, $\omega_R$ [rad/s], via:

$$p\lambda_S = \sigma L_S \cdot pi_F + (L_S/\tau_R - j\omega_R \cdot \sigma L_S) \cdot i_F + (j\omega_R - 1/\tau_R) \cdot \lambda_S \qquad \text{Equation 27}$$

where $L_S$ is the stator inductance; $\sigma$ is the total leakage factor; $\tau R$ is the rotor time constant. The rotor time constant is defined as the ratio between the rotor inductance, $L_R$, and the rotor resistance, $R_R$, i.e., $\tau R = L_R/R_R$. The imaginary unit j rotates the complex space vector counter-clockwise by $\pi/2$.

Stator Resistance

An estimate of stator resistance is conveniently produced based on the motor nameplate data. This estimate is calculated as a ratio of a nameplate voltage, $v_0$, and a nameplate current, $i_0$, scaled by a scalar constant, $\alpha_R$.

$$R_S = \alpha_R \cdot \left(\frac{v_0}{i_0}\right)\Big|_{\alpha_R = 1.155e-2} \Omega \qquad \text{Equation 28}$$

where the nameplate voltage is typically a line-to-line root mean square rated voltage, and the nameplate current is typically a single phase root mean square rated current.

Induction Motor Electrical Parameters

The process of estimating induction motor electrical parameters is illustrated as a compound process, as two distinct and independent methods, each expressing relative strengths and advantages. A first method is an Efficient Recursive Method, described in the section below entitled Efficient Recursive Method. A second method is a Maximum Diversity Method, described in the section below entitled Maximum Diversity Method. The induction motor electrical parameters, $L_{S,m}$, $\sigma_m$, and $\tau_{R,0,m}$, determined by either the Efficient Recursive Method or the Maximum Diversity Method, are equally valid, and the selection of the specific method to employ is application dependent.

The Efficient Recursive Method supports the definition and evaluation of a source matrix and a source vector with a variable row dimension, with a recursive solution. The Maximum Diversity Method defines a source matrix and a source vector with fixed dimensions, opportunistically replacing rows when new information is available, to ensure that the condition of derived matrix, and the accuracy of the solution vector are optimized.

Induction Motor Equivalent Circuit Model Equations

The stator inductance, the total leakage factor and the rotor time constant are estimated according to the dynamic induction motor equivalent circuit 1300 shown in FIG. 13 by substituting Equation 26 to Equation 27, which yields Equation 29:

$$v_F - R_S \cdot i_F = \sigma L_S \cdot pi_F + (L_S/\tau_R - j\omega_R \cdot \sigma L_S) \cdot i_F + (j\omega_R - 1/\tau_R)\lambda_S \qquad \text{Equation 29}$$

Rearranging equation 29 yields:

$$\sigma L_S \cdot (pi_F - j\omega_R \cdot i_F) = -(L_S/\tau_R) \cdot i_F + (1/\tau_R)\lambda_S + [(v_F - R_S \cdot i_F) - j\omega_R \cdot \lambda_S] \qquad \text{Equation 30}$$

Dividing both sides of Equation 30 by $\sigma L_S$ and then taking the continuous-time derivative of both sides yield:

$$p^2 i_F - j\omega_R \cdot (pi_F) = [L_S/(\sigma L_S \tau_R)] \cdot (-pi_F) + [1/(\sigma L_S \tau_R)] \cdot (p\lambda_S) + [1/(\sigma L_S)] \cdot [p(v_F - R_S \cdot i_F) - j\omega_R \cdot p\lambda_S] \qquad \text{Equation 31}$$

where $p^2 i_F$ denotes the second-order continuous-time derivative of the positive sequence fundamental frequency current component (e.g., $p^2 i_F = d^2(i_F)/dt^2$). Equation 30 can be simplified by replacing $p\lambda_S$ with $(v_F - R_S \cdot i_F)$ according to Equation (27), which yields:

$$p^2 i_F - j\omega_R \cdot (pi_F) = [L_S/(\sigma L_S \tau_R)] \cdot (-pi_F) + [1/(\sigma L_S \tau_R)] \cdot (v_F - R_S \cdot i_F) + [1/(\sigma L_S)] \cdot [p(v_F - R_S \cdot i_F) - j\omega_R \cdot (v_F - R_S \cdot i_F)] \qquad \text{Equation 32}$$

Equation 32 can be written in a matrix form by defining the following quantities:

$$y = p^2 i_F - j\omega_R \cdot (pi_F) \qquad \text{Equation 33}$$

$$\vec{u} = [-pi_F, v_F - R_S \cdot i_F, p(v_F - R_S \cdot i_F) - j\omega_R \cdot (v_F - R_S \cdot i_F)] \qquad \text{Equation 34}$$

$$\vec{\xi} = [L_S/(\sigma L_S \tau_R), 1/(\sigma L_S \tau_R), 1/(\sigma L_S)]^T \qquad \text{Equation 35}$$

where the superscript T in Equation 35 denotes the matrix transpose. Note that it is not a complex conjugate transpose.

Consequently, Equation 32 can be transformed into matrix format as defined in Equation 36.

$$y = \vec{u} \cdot \vec{\xi} \qquad \text{Equation 36}$$

Calculation of y and u

Figure 14:
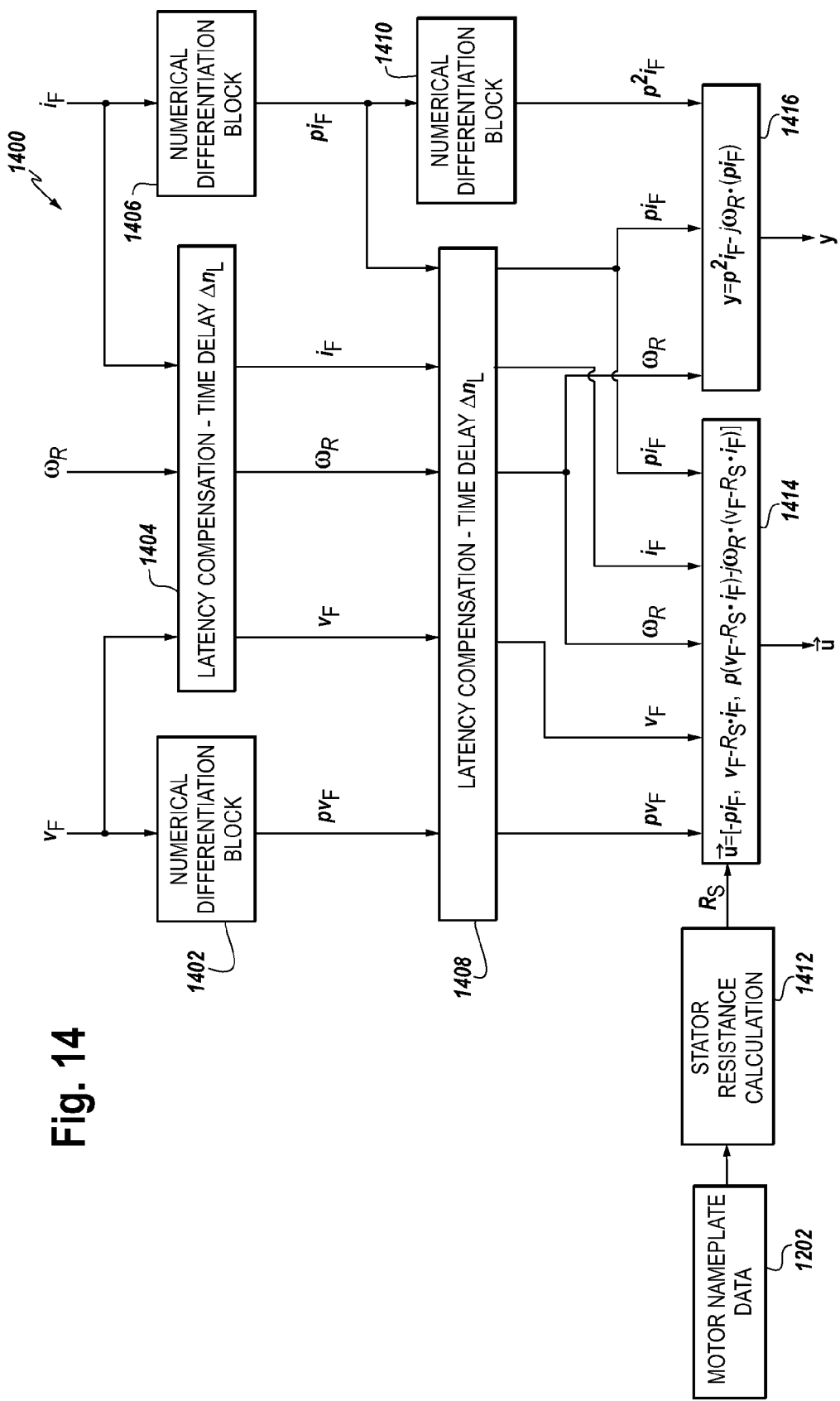
FIG. 14 is a block diagram illustrating methods of determining various quantities used for estimating induction motor electrical parameters according to some aspects.

Given a sequence of samples of positive sequence fundamental frequency voltage and current components, it is desirable to use a numerical differentiation block to compute first-order continuous-time derivative of the positive sequence fundamental frequency voltage and current components, $pv_F$ and $pi_F$, respectively; as well as second-order continuous-time derivative of the positive sequence fundamental frequency current component, $p^2 i_F$. The structure of the numerical differentiation block used here is described in the section entitled Numerical Differentiation Block. FIG. 14 shows the temporal alignment that needs to be carefully considered in the implementation.

Temporal Alignment

As shown in FIG. 14, two numerical differentiation blocks 1406, 1410 on the right are cascaded to compute second-order continuous-time derivative of the positive sequence fundamental frequency current component (e.g., $p^2 i_F$). When Kaiser window-based discrete-time differentiators are used, the latency introduced by the differentiator must be compensated. The "Latency Compensation—Time Delay $\Delta n_L$" blocks 1404, 1408 in FIG. 14 ensure the temporal alignment among all signals for subsequent calculations. The time delay, $\Delta n_L$, is typically obtained by evaluating a differentiator's architecture during its design stage.

Least-Squares Solution

According to some aspects, for motor operation that covers more than one load level, one $y_i$ and one $\vec{u}_i$ can be formed for each load level. Consequently, a vector, $\vec{y}$, can be obtained for m load levels along with a matrix, $\vec{U}$, where $\vec{y}$ is defined according to Equation 37 and $\vec{U}$ is defined according to Equation 38.

$$\vec{y} = [y_1, y_2, \ldots, y_i, \ldots, y_m]^T \quad \text{Equation 37}$$

$$\vec{U} = [\vec{u}_1^T, \vec{u}_2^T, \ldots, \vec{u}_i^T, \ldots, \vec{u}_m^T]^T \quad \text{Equation 38}$$

Consequently, Equation 36 can be expanded for motor operation with m load levels according to Equation 39.

$$\vec{y} = \vec{U} \cdot \vec{\xi} \quad \text{Equation 39}$$

According to some aspects, $\vec{y}_m$ and $\vec{U}_m$ can be constructed by taking the real and/or imaginary part of components in $\vec{y}$ and $\vec{U}$ separately as defined in Equations 40a,b,c and 41a,b,c.

$$\vec{y}_m = [\text{real}(y_1), \text{imag}(y_1), \text{real}(y_2), \text{imag}(y_2), \text{real}(y_i), \text{imag}(y_i), \ldots, \text{real}(y_m), \text{imag}(y_m)]^T \quad \text{Equation 40a}$$

$$\vec{U}_m = [\text{real}(\vec{u}_1^T), \text{imag}(\vec{u}_1^T), \text{real}(\vec{u}_2^T), \text{imag}(\vec{u}_2^T), \ldots, \text{real}(\vec{u}_i^T), \text{imag}(\vec{u}_i^T), \ldots, \text{real}(\vec{u}_m^T), \text{imag}(\vec{u}_m^T)]^T \quad \text{Equation 41a}$$

$$\vec{y}_m = [\text{real}(y_1), \text{real}(y_2), \ldots, \text{real}(y_i), \ldots, \text{real}(y_m)]^T \quad \text{Equation 40b}$$

$$\vec{U}_m = [\text{real}(\vec{u}_1^T), \text{real}(\vec{u}_2^T), \ldots, \text{real}(\vec{u}_i^T), \ldots, \text{real}(\vec{u}_m^T)]^T \quad \text{Equation 41b}$$

$$\vec{y}_m = [\text{imag}(y_1), \text{imag}(y_2), \ldots, \text{imag}(y_i), \ldots, \text{imag}(y_m)]^T \quad \text{Equation 40c}$$

$$\vec{U}_m = [\text{imag}(\vec{u}_1^T), \text{imag}(\vec{u}_2^T), \ldots, \text{imag}(\vec{u}_i^T), \ldots, \text{imag}(\vec{u}_m^T)]^T \quad \text{Equation 41c}$$

At least two distinct load levels are required if Equations 40a and 41a are used to construct $\vec{y}_m$ and $\vec{U}_m$, (e.g., m≧2). In case either Equations 40b and 41b, or Equations 40c and 41c, are used to construct $\vec{y}_m$ and $\vec{U}_m$, then at least three distinct load levels are required (e.g., m≧3).

A least-squares solution can be obtained from Equation 39 via a pseudo-inverse solution as defined in Equation 42.

$$\vec{\xi}_m = (\vec{U}_m^T \vec{U}_m)^{-1} \cdot (\vec{U}_m^T \vec{y}_m) \quad \text{Equation 42}$$

Finally, based on the definitions of Equation 35, $\vec{\xi}_m(1) = L_S/(\sigma L_S \tau_R)$, $\vec{\xi}_m(2) = 1/(\sigma L_S \tau_R)$, $\vec{\xi}_m(3) = 1/(\sigma L_S)$. Therefore, the stator inductance, the total leakage factor, and the rotor time constant can be estimated from the least-squares solution produced by Equation 42, where the stator inductance, $L_S$, is defined in Equation 43; the total leakage factor, $\sigma$, is defined in Equation 44; and the rotor time constant, $\tau_R$, is defined in Equation 45.

$$L_{S,m} = \vec{\xi}_m(1) / \vec{\xi}_m(2) \quad \text{Equation 43}$$

$$\sigma_m = \vec{\xi}_m(2) / [\vec{\xi}_m(1) \vec{\xi}_m(3)] \quad \text{Equation 44}$$

$$\tau_{R,0,m} = \vec{\xi}_m(3) / \vec{\xi}_m(2) \quad \text{Equation 45}$$

This $\tau_{R,0,m}$ can be the same as an initial rotor time constant, $\tau_{R,0}$, outputted by the induction motor electrical parameter estimation block (1204).

As discussed above, the induction motor electrical parameter estimation given in Equations 43-45 relies on the least-squares solution of $\vec{\xi}_m$ in Equation 42. Thus, according to some aspects, matrix $\vec{U}_m^T \vec{U}_m$ is checked to not be singular before performing the matrix inverse, $(\vec{U}_m^T \vec{U}_m)^{-1}$. Instead of performing a conventional singular value decomposition for this purpose, readily available quantities can be used more efficiently, such as the complex input power, as indices to ensure a nonsingular $\vec{U}_m^T \vec{U}_m$. The complex input power is defined in the "Initial Synthesis" section below.

Efficient Recursive Method

Figure 15:
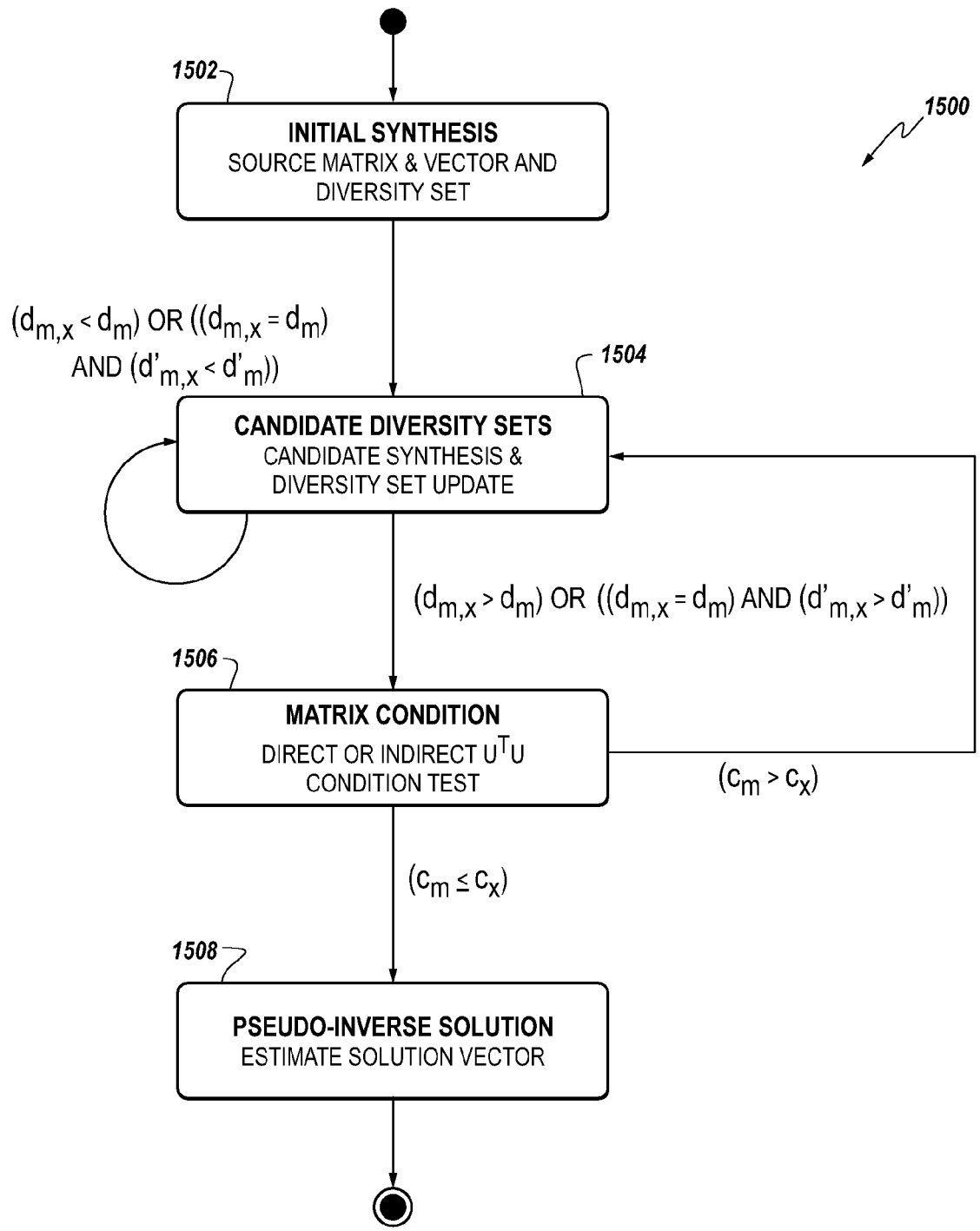
FIG. 15 is a flow chart in a unified modeling language (UML) defining a matrix condition and pseudo-inverse solution according to some aspects.
Figure 16:
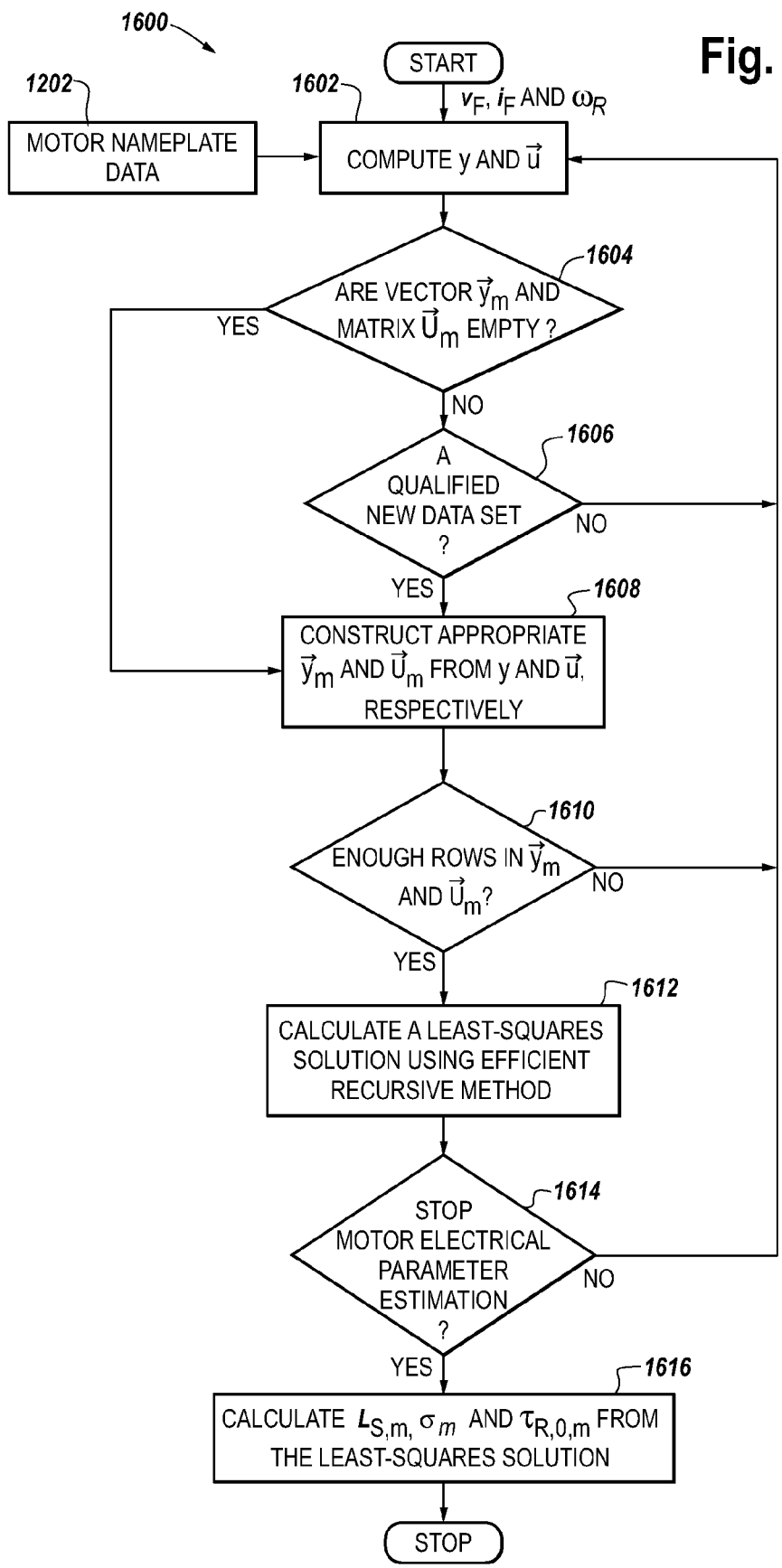
FIG. 16 is a flow diagram of methods for performing an efficient recursive method for estimating induction motor electrical parameters.

An efficient recursive method is described in this section as an efficient way to reduce the computation of the pseudo-inverse in Equation 42 each time a new set of qualified data becomes available, as shown in the flow chart of FIG. 16. Unlike the Maximum Diversity Method (e.g., 1500 in FIG. 15), which operates on the vector, $\vec{y}$, and the matrix, $\vec{U}$, whose number of rows is fixed, the Efficient Recursive Method has no such restrictions and can be applied to a vector, $\vec{y}$, and a matrix, $\vec{U}$, with a growing number of rows.

The efficient recursive method first determines if vector $\vec{y}_m$ and matrix $\vec{U}_m$ are empty (1604) (e.g., whether they contain any values). If vector $\vec{y}_m$ and matrix $\vec{U}_m$ are empty, then the appropriate $\vec{y}_m$ and $\vec{U}_m$ are automatically constructed (1608). It is possible to construct vector $\vec{y}_m$ and matrix $\vec{U}_m$ according to Equations 40b and 41b, where $\vec{U}_m^T \cdot \vec{U}_m$ and $\vec{U}_m^T \cdot \vec{y}_m$ are assumed to have been computed in accordance with a Least-Squares Solution obtained from Equation 42 (1612). If the vector $\vec{y}_m$ and the matrix $\vec{U}_m$ are not empty, then an intermediate index, $s_{IN}$, can be defined based on the complex input power or a quantity derived from the complex input power. There are altogether m intermediate indices related to $\vec{y}_m$ and $\vec{U}_m$, (e.g., $S_{IN,k}$), where k is a discrete index (1≦k≦m), and each k corresponds to one distinct row in $\vec{y}_m$ and $\vec{U}_m$.

Whenever a new set of voltage and current measurements (e.g., 102 and 104) becomes available, an intermediate index, $s_{IN,NEW}$, can be computed for this new data set. This intermediate index can then be compared to the existing m intermediate indices associated with m rows of $\vec{y}_m$ and $\vec{U}_m$, and $m$ non-negative distances are calculated between $s_{IN,NEW}$ and $s_{IN,k}$ ($1 \leq k \leq m$) according to:

$$\Delta s_{IN,k} = \|s_{IN,NEW} - s_{IN,k}\|, \quad 1 \leq k \leq m \qquad \text{Equation 46}$$

where the $\|\cdot\|$ denotes either an absolute value or an Euclidean norm.

Taking a minimum value of m distances from Equation 46 yields:

$$d_{IN} = \min([\Delta s_{IN,1}, \Delta s_{IN,2}, \ldots, \Delta s_{IN,k}, \ldots, \Delta s_{IN,m}]^T) \qquad \text{Equation 47}$$

A diversity index, $d_{IN}$, is computed for each new data set. This diversity index is subsequently compared to a threshold, predetermined from the motor nameplate data. If the diversity index exceeds the threshold, then the new data set is regarded as a qualified data set (1606). This comparison procedure ensures that the matrix $\vec{U}$ will not become ill-conditioned when solving Equation 42.

Each time a qualified new data set is available, the corresponding y and $\vec{u}$, denoted by a new quantity $y_{m+1}$ and a new vector $\vec{u}_{m+1}$, are appended to $\vec{y}_m$ and $\vec{U}_m$ respectively (1608):

$$\vec{y}_{m+1} = [\vec{y}_m^T, \text{real}(y_{m+1})]^T \qquad \text{Equation 48}$$

$$\vec{U}_{m+1} = [\vec{U}_m^T, \text{real}(\vec{u}_{m+1}^T)]^T \qquad \text{Equation 49}$$

Consequently, the matrices in equation 42 are updated via:

$$\vec{U}_{m+1}^T \cdot \vec{U}_{m+1} = [\vec{U}_m^T, \vec{u}_{m+1}^T]^T \cdot [\vec{U}_m^T, \vec{u}_{m+1}^T]^T = \vec{U}_m^T \cdot \vec{U}_m + \vec{u}_{m+1}^T \cdot \vec{u}_{m+1} \qquad \text{Equation 50}$$

$$\vec{U}_{m+1}^T \cdot \vec{y}_{m+1} = [\vec{U}_m^T, \vec{u}_{m+1}^T]^T \cdot [\vec{y}_m^T, y_{m+1}]^T = \vec{U}_m^T \cdot \vec{y}_m + \vec{u}_{m+1}^T \cdot y_{m+1} \qquad \text{Equation 51}$$

Once enough rows are accumulated (e.g., $m \geq 3$), (1610) the estimated electrical parameters become:

$$\vec{\xi}_{m+1} = (\vec{U}_{m+1}^T \vec{U}_{m+1})^{-1} \cdot (\vec{U}_{m+1}^T \vec{y}_{m+1}) = \vec{U}_m^T \cdot \vec{U}_m + \vec{u}_{m+1}^T)^{-1} \cdot (\vec{U}_m^T \cdot \vec{y}_m + \vec{u}_{m+1}^T \cdot y_{m+1}) \qquad \text{Equation 52}$$

Since the matrices $\vec{U}_m^T \cdot \vec{U}_m$ and $\vec{U}_m^T \cdot \vec{y}_m$ have previously been computed with $m \geq 3$, it is now only necessary to compute $\vec{u}_{m+1}^T \vec{U}_{m+1}$ and $\vec{u}_{m+1}^T \cdot y_{m+1}$ and subsequently to inverse a 3 by 3 matrix to solve for the least-squares solution of $\xi_{m+1}$ (1612). This procedure helps significantly reduce the computation time in the electrical parameter estimation each time a qualified new data set becomes available. By doing so, the induction motor electrical parameters computed from $\xi_{m+1}$, following the same manner as Equations 43-45, benefit from the knowledge brought by the qualified new quantity $y_{m+1}$ and the qualified new vector $\vec{u}_{m+1}$. After the vector $\vec{y}$ and the matrix $\vec{U}$ contain enough rows and sufficiently qualified (e.g., diverse) data sets to support the least-squares solution of $\vec{\xi}$, the induction motor electrical parameter estimation can be ceased (1614).

In case $\vec{y}_m$ and $\vec{U}_m$ are constructed according to either Equations 40a and 41a, or Equations 40c and 41c, comparably efficient equations (e.g., Equations 48-52) can be executed to produce estimation results. As shown in Equation 34, the structure of the vector $\vec{u}$ and consequently the matrix $\vec{U}$ makes $\vec{U}_m^T \vec{U}_m$ a well-conditioned matrix once the conditions described above are satisfied. Therefore, a robust and efficient estimate of induction motor electrical parameters can be obtained (e.g., Equations 43-45) based on the above description. A default transition to the terminus can be defined, and the stator inductance, the total leakage factor, and the rotor time constant are produced as the output (1616).

Maximum Diversity Method

The Maximum Diversity Method (1500) defines a source matrix and a source vector with fixed dimensions, opportunistically replacing rows when new information is available, to ensure that the condition of derived matrix, and the accuracy of the solution vector is optimized.

Control flow presents an alternative system view, where the nature of the relationships between entities and processes are defined in terms of order and conditions of operation, in FIG. 15.

The epoch of control flow transitions to the Initial Synthesis process (1502).

The Initial Synthesis process (1502) constructs the initial representations of the source matrix, the source vector, and the diversity set. The diversity set is employed as an indirect means to estimate the condition of a matrix derived from the source matrix, ensuring robust and accurate subsequent definition of a solution vector. Minimum distance and mean distance are calculated, with respect to members of the initial diversity set. The Initial Synthesis process (1502) initializes the relevant values precisely once. In subsequent invocations, the process performs no actions. The Initial Synthesis process (1502) transitions to the Candidate Diversity Sets process.

The Candidate Diversity Sets process (1504) iteratively synthesizes candidate diversity sets, or potential replacements to the existing diversity set, formed by substituting a new value for each member of the existing set. For each candidate diversity set, a minimum distance is evaluated, and the maximum minimum distance is compared to the minimum distance of the diversity set. If the maximum candidate minimum distance is greater than the minimum distance of the diversity set, or if the distances are equal and the candidate mean distance is greater than the mean distance of the diversity set, the source matrix, source vector, diversity set, minimum distance and mean distance associated with a selected candidate diversity set are modified, and the Candidate Diversity Set process transitions to the Matrix Condition process. If the diversity set remains unchanged, the Candidate Diversity Sets process transitions to itself at the next sequential increment of the synchronous temporal index.

The Matrix Condition process (1506) evaluates the condition of the matrix $\vec{U}_m^T \vec{U}_m$ by either direct or indirect means. An indirect means of evaluating the condition of the matrix is defined through a process of maximizing the minimum distance between any two members of a diversity set. The basis for the diversity set is selected such that the minimum distance, or diversity of the set, corresponds, positively or inversely, to the condition of the matrix $\vec{U}_m^T \vec{U}_m$. The application of the diversity set is an economic means to evaluate the condition, which would otherwise be computationally prohibitive and impractical in many environments. If the condition number is below a specified threshold, in direct evaluation, or a minimum distance is above a specified threshold, in indirect evaluation, the Matrix Condition process transitions to the Pseudo-Inverse Solution process. If the condition is insufficient to support a solution, the Matrix Condition process transitions to the Candidate Diversity Sets process at the next sequential increment of the synchronous temporal index.

The Pseudo-Inverse Solution process (1508) applies the Moore-Penrose pseudo-inverse method to extract a solution vector from the source matrix and the source vector, facilitating the direct definition of stator inductance, total leakage factor, and initial rotor time constant from the solution vector. The Pseudo-Inverse Solution process (1508) transitions to the terminus of control flow.

It is possible, and recommended, that the process of solving the induction motor electrical parameters not be terminated after the first available solution is extracted, but rather iteratively refined through continued application of the techniques described in the Maximum Diversity Method process. As new information is extracted through passive observation of motor operation, the resulting solution vector will become more robust and accurate, and can be used with greater confidence. If computational complexity is a significant concern, the synchronous temporal index can be accessed with a greater than unity stride, effectively downsampling the basis for the diversity set, and reducing the bandwidth required by a linear factor equal to the inverse of the stride. This is generally a reasonable compromise, as potential basis values extracted from motor electrical signals, including complex input power and complex impedance, cannot change instantaneously and are generally quasi-stationary for periods which significantly exceed the sampling frequency.

A practical temporal stride value can be selected such that the effective sampling frequency is reduced to no less than two times the rated fundamental frequency. For example, in a system with a sampling frequency of 5 kHz, and a rated fundamental frequency equal to 60 Hz, a stride of less than or equal to 40 is recommended.

The source matrix $\vec{U}_m$ is composed of $N_D$ rows formed from independent observations of complex fundamental voltage, complex fundamental current and rotor speed signals. The complex fundamental voltage can be the same as the positive sequence fundamental frequency voltage component (e.g., 704). The complex fundamental current can be the same as the positive sequence fundamental frequency current component (e.g., 714). Asynchronous temporal index m is applied as a means to enumerate successive asynchronous estimates, or opportunistic updates. The row dimension, $N_D$, must be greater than or equal to 3 to support the application of the Moore-Penrose pseudo-inverse method, based on the dimension of the solution vector, $\vec{\xi}_m$. A practical dimension, $N_D$, typically defines 10 or more observations.

The rows of the source matrix are independent, though not necessarily sufficiently diverse to support definition of a solution vector. If the rows of the source matrix are representative of too narrow a range of operating conditions, the square and potentially invertible matrix $\vec{U}_m^T \vec{U}_m$ can be ill-conditioned, or nearly singular. The matrix $\vec{U}_m^T \vec{U}_m$ must be sufficiently well-conditioned to support a solution.

The source matrix $\vec{U}_m$ and source vector $\vec{y}_m$ are defined and allowed to evolve opportunistically, with each observation of a diversity basis determined to increase diversity of the rows of $\vec{U}_m$, and correspondingly decrease the condition number of the matrix $\vec{U}_m^T \vec{U}_m$. When the matrix $\vec{U}_m^T \vec{U}_m$ is sufficiently well-conditioned, the solution vector is extracted. A single estimate of the solution vector can be sufficient, or the solution can be improved with subsequent iterations of the source matrix in an application-dependent manner.

Initial Synthesis

An initial matrix $\vec{U}_0$ is formed by application of Equation 34 to $N_D$ sequential samples of complex fundamental voltage and complex fundamental current, in Equation 53.

$$\vec{U}_0 = \text{REAL} \begin{bmatrix} -pi_{F,n-N_D+1} & v_{F,n-N_D+1} - R_S \cdot i_{F,n-N_D+1} & p\left(\dfrac{v_{F,n-N_D+1}-}{R_S \cdot i_{F,n-N_D+1}}\right) - j \cdot \omega_{R,n-N_D+1} \cdot \left(\dfrac{v_{F,n-N_D+1}-}{R_S \cdot i_{F,n-N_D+1}}\right) \\ -pi_{F,n-N_D+2} & v_{F,n-N_D+2} - R_S \cdot i_{F,n-N_D+2} & p\left(\dfrac{v_{F,n-N_D+2}-}{R_S \cdot i_{F,n-N_D+2}}\right) - j \cdot \omega_{R,n-N_D+2} \cdot \left(\dfrac{v_{F,n-N_D+2}-}{R_S \cdot i_{F,n-N_D+2}}\right) \\ \vdots & & \\ -pi_{F,n} & v_{F,n} - R_S \cdot i_{F,n} & p(v_{F,n} - R_S \cdot i_{F,n}) - j \cdot \omega_{R,n} \cdot (v_{F,n} - R_S \cdot i_{F,n}) \end{bmatrix}_{N_D \geq 3}$$

Equation 53

An initial source vector $y_0$ is formed once by application of Equation 33 to $N_D$ sequential samples of complex fundamental current and rotor speed, in Equation 54.

$$\vec{y}_0 = \text{REAL} \begin{bmatrix} p^2 i_{F,n-N_D+1} - j \cdot \omega_{R,n-N_D+1} \cdot pi_{F,n-N_D+1} \\ p^2 i_{F,n-N_D+2} - j \cdot \omega_{R,n-N_D+2} \cdot pi_{F,n-N_D+2} \\ \vdots \\ p^2 i_{F,n} - j \cdot \omega_{R,n} \cdot pi_{F,n} \end{bmatrix}_{N_D \geq 3}$$

Equation 54

Source matrix and source vector definitions correspond to real projections, as defined in Equation 41b and 40b. Imaginary projections, or interlaced real and imaginary projections are valid alternatives, as defined in Equation 41c, 40c and Equation 41a and 40a, respectively.

Complex input power, $\rho_{F,n}$, is defined in Equation 55, $$\rho_{F,n} = \frac{3^{0.5} \cdot v_{F,n} \cdot i_{F,n}^*}{2 \cdot P_F}$$

Equation 55 where $P_F$ is a rated power factor from the motor nameplate data, and the superscript * denotes the complex conjugate of a complex number.

An initial diversity set, $\vec{D}_0$, is formed once with $N_D$ sequential samples of complex input power at sample indices corresponding to row synthesis in the initial matrix $\vec{U}_0$, in Equation 56:

$$\vec{D}_0 = \{\rho_{F,n-N_D+1} \rho_{F,n-N_D+2} \cdots \rho_{F,n}\}|_{N_D \geq 3} \qquad \text{Equation 56}$$

The diversity of the source matrix $\vec{U}_0$ is indirectly specified in the diversity set, employing a basis of the complex input power as a matter of convenience. Complex input power, complex input impedance, and the real or imaginary projections of these signals can be used as an alternative basis to specify diversity.

The distance, $\delta_{m,j,k}$, is an Euclidean distance between any two members of the diversity set, at independent indices j and k, in Equation 57:

$$\delta_{m,j,k} = |D_{m,j} - D_{m,k}| \Big|_{\substack{j,k\ :[0,N_D-1] \\ j \neq k \\ N \geq 3}} \qquad \text{Equation 57}$$

A minimum distance, $d_m$, is the minimum Euclidian distance between all unique combination of members of the diversity set, $\vec{D}_m$, in Equation 58:

$$d_m = {}_{MIN}(\delta_{m,j,k}) \Big|_{\substack{j,k\ :[0,N_D-1] \\ j \neq k \\ N \geq 3}} \qquad \text{Equation 58}$$

The mean distance, $d'_m$, is the mean Euclidean distance between each member pair of the diversity set $\vec{D}_m$, in Equation 59:

$$\bar{d}_m = \left(\frac{1}{\sum_{c=1}^{N_D-1} c}\right) \cdot \sum_{j=0}^{N_D-2} \sum_{k=j+1}^{N_D-1} \delta_{m,j,k} \Bigg|_{N_D \geq 3} \qquad \text{Equation 59}$$

According to some aspects, an initial minimum distance, $d_0$, and mean distance, $d'_0$, are calculated once for the initial diversity set, $\vec{D}_0$, and retained for comparison to values extracted from candidate diversity sets.

Candidate Diversity Sets

At each successive index, n, a sample of complex input power, or alternative diversity basis, can be evaluated to determine if it should replace an existing member of the diversity set. Alternatively, a temporal index stride greater than unity can be selected to conserve bandwidth, and it is generally not possible to have instantaneous changes in the basis for the diversity set. Candidate diversity sets, $\vec{D}_{m,c}$, are synthesized by temporarily replacing an existing member at index c with the new sample, forming $N_D$ unique candidate diversity sets, in Equation 60:

$$\vec{D}_{m,c} = \{\vec{D}_m : D_{m,j} = \rho_{F,n}\}\Big|_{\substack{c,j\ :[0,N_D-1] \\ c=j \\ N_D \geq 3}} \qquad \text{Equation 60}$$

The Candidate distance, $\delta_{m,c,j,k}$, is computed for any two members of each candidate diversity set, $\vec{D}_{m,c}$, at independent indices j and k, in Equation 61:

$$\delta_{m,c,j,k} = |D_{m,c,j} - D_{m,c,k}| \Big|_{\substack{c,j,k\ :[0,N_D-1] \\ j \neq k \\ N_D \geq 3}} \qquad \text{Equation 61}$$

The Candidate minimum distance, $d_{m,c}$, is the distance between the two most proximate members of a candidate diversity set, $\vec{D}_{m,c}$, in Equation 62:

$$d_{m,c} = {}_{MIN}(\delta_{m,c,j,k}) \Big|_{\substack{c,j,k\ :[0,N_D-1] \\ j \neq k \\ N_D \geq 3}} \qquad \text{Equation 62}$$

The maximum candidate minimum distance, $d_{m,z}$, is identified at set index z in the $N_D$ candidate diversity sets, $\vec{D}_{m,c}$, in Equation 63:

$$d_{m,z} = {}_{MAX}(d_{m,c}) \Big|_{\substack{c,z\ :[0,N_D-1] \\ N_D \geq 3}} \qquad \text{Equation 63}$$

In some aspects, if the maximum candidate minimum distance, $d_{m,z}$, is greater than or equal to the existing minimum distance, $d_m$, the mean candidate distance, $d'_{m,z}$, is evaluated corresponding to the candidate diversity set, $\vec{D}_{m,z}$, with set index z, in Equation 64:

$$\bar{d}_{m,z} = \left(\frac{1}{\sum_{c=1}^{N_D-1} c}\right) \cdot \sum_{j=0}^{N_D-2} \sum_{k=j+1}^{N_D-1} \delta_{m,c,j,k} \Bigg|_{\substack{c,z\ :[0,N_D-1] \\ N_D \geq 3}} \qquad \text{Equation 64}$$

In some aspects, if the maximum candidate minimum distance, $d_{m,z}$, is greater than the existing minimum distance, $d_m$, or if the maximum candidate minimum distance is equal to the existing minimum distance and the candidate mean distance, $d'_{m,z}$, is greater than the existing mean distance, $d'_m$, it is implicit that the condition of the matrix $\vec{U}_m^T \vec{U}_m$ would be improved by updating the matrix $\vec{U}_{m+1}$, by synthesizing a new vector to replace the existing row at index z, in Equation 65.

$$\vec{U}_{m+1} = \left\{ \vec{U}_m : \vec{U}_{m,z} = \left[ -pi_{F,n} \quad v_{F,n} - R_S \cdot i_{F,n} \quad \begin{array}{c} p\left(\dfrac{v_{F,n}-}{R_S \cdot i_{F,n}}\right) - \\ j \cdot \omega_{R,n} \cdot \left(\dfrac{v_{F,n}-}{R_S \cdot i_{F,n}}\right) \end{array} \right]_{\substack{d_{m,z}>d_m \\ d_{m,z}=d_m, \\ \bar{d}_{m,z}>\bar{d}_m}} \right\}$$

Equation 65

Source vector $\vec{y}_{m+1}$ is equal to the previous vector, $\vec{y}_m$, modified by synthesizing a new value to replace the existing row at index z, in Equation 66:

$$\vec{y}_{m+1} = \{\vec{y}_m : y_{m,z} = p^2 i_{F,n} - j \cdot \omega_{R,n} \cdot pi_{F,n}|_{\substack{d_{m,z}>d_m \\ d_{m,z}=d_m, \\ \bar{d}_{m,z}>\bar{d}_m}}\}$$

Equation 66

Diversity set, $\vec{D}_{m+1}$, is equal to the candidate diversity set, $\vec{D}_{m,z}$, corresponding to the basis sample substitution at index z, in Equation 67:

$$\vec{D}_{m+1} = \vec{D}_{m,z}|_{\substack{d_{m,z}>d_m \\ d_{m,z}=d_m, \bar{d}_{m,z}>\bar{d}_m}}$$

Equation 67

The minimum distance, $d_{m+1}$, is equal to the candidate diversity, $d_{m,z}$, at index z, in Equation 68:

$$d_{m+1} = d_{m,z}|_{\substack{d_{m,z}>d_m \\ d_{m,z}=d_m, \bar{d}_{m,z}>\bar{d}_m}}$$

Equation 68

The mean distance, $d'_{m+1}$, is equal to the candidate mean distance, $d'_{m,z}$, at index z, in Equation 69:

$$\bar{d}_{m+1} = \bar{d}_{m,z}|_{\substack{d_{m,z}>d_m \\ d_{m,z}=d_m, \bar{d}_{m,z}>\bar{d}_m}}$$

Equation 69

In some aspects, if the candidate diversity sets, $\vec{D}_{m,c}$, do not produce a candidate, $\vec{D}_{m,z}$, which is more diverse than the existing diversity set, $\vec{D}_m$, then the process of synthesis and evaluation of candidate diversity sets can be repeated at each subsequent sample index until the opportunity to improve the diversity of the set is observed.

Matrix Condition

For each new definition of the diversity set, the matrix $\vec{U}_m^T \vec{U}_m$ can be evaluated to determine if the matrix condition is sufficient to support the definition of the solution vector. The condition of the matrix $\vec{U}_m^T \vec{U}_m$ determines the sensitivity of the solution vector to perturbations in the matrix. Sensitivity analysis can be performed through direct or indirect means, though direct analysis is often computationally impractical.

Condition number, $c_m$, a direct measure of the sensitivity of the solution vector $\vec{\xi}_m$ to perturbations in the matrix $\vec{U}_m^T \vec{U}_m$, is defined as the magnitude of the ratio of the maximum and minimum eigenvalues of the matrix, in Equation 70.

$$c_m = \left|\frac{\lambda_{m,x}}{\lambda_{m,y}}\right|_{\lambda_{m,x} \geq \lambda_{m,j} \geq \lambda_{m,y}}$$

Equation 70

The Eigenvalues, $\vec{\lambda}_m$, of the matrix $\vec{U}_m^T \vec{U}_m$ can be extracted by solving a characteristic polynomial associated with the matrix. Eigenvalues are the roots of the characteristic polynomial, in Equation 71.

$$DET(\vec{U}_m^T \cdot \vec{U}_m - \vec{\lambda}_m \cdot \vec{I}) = 0$$

Equation 71

According to some aspects, the matrix $\vec{U}_m^T \vec{U}_m$ is relatively small, with dimension [3, 3], thus, eigenvalues can be extracted with reasonable efficiency through a direct solution to a third order characteristic polynomial, expressed in terms of matrix determinant, DET, and trace, TR, operations, in Equation 72.

$$-\vec{\lambda}_m^3 + \vec{\lambda}_m^2 \cdot TR\left(\vec{U}_m^T \cdot \vec{U}_m\right) + \frac{\vec{\lambda}_m}{2} \cdot \left[TR\left(\left(\vec{U}_m^T \cdot \vec{U}_m\right)^2\right) - TR\left(\vec{U}_m^T \cdot \vec{U}_m\right)^2\right] + DET\left(\vec{U}_m^T \cdot \vec{U}_m\right) = 0$$

Equation 72

Condition number, cm, of the matrix $\vec{U}_m^T \vec{U}_m$ approaches unity when the matrix is well-conditioned, and has eigenvalues which are nearly equal, and approaches infinity when the matrix is nearly singular, and has asymmetric eigenvalues.

A static maximum condition number, $c_x$, can be defined to determine if the matrix $\vec{U}_m^T \vec{U}_m$ is sufficiently well-conditioned to extract a solution vector. The maximum condition number, $c_L$, is defined through sensitivity analysis of the elements of the solution vector, based on application-specific requirements.

Practical variants of the algorithm include evaluation of the condition number, $c_m$, after several successive iterations to the matrix $\vec{U}_m$, or only if the minimum distance $d_m$, exceeds a threshold, $d_y$. According to some aspects, alternative eigenvalue estimation methods can be applied to reduce computational complexity. Numerical stability analysis can also be addressed.

An efficient, practical, indirect method of estimating the condition of the matrix $\vec{U}_m^T \vec{U}_m$ can omit synthesis of condition number, cm, entirely. The basis for the diversity set, $\vec{D}_m$, is selected based on the assumption that an increase in the minimum distance, $d_m$, of the set yields a decrease in the condition number of the related matrix $\vec{U}_m^T \vec{U}_m$. While the distance and the condition number correlate, it is possible that their relationship is not linear.

In some aspects, in lieu of a condition number synthesis, a static minimum distance, $d_y$, can be defined to indirectly determine if the matrix $\vec{U}_m^T \vec{U}_m$ is sufficiently well-conditioned to support a solution. In these aspects, a minimum distance threshold, $d_y$, is defined experimentally to result in a solution that is accurate enough to support the needs of a specific application.

Pseudo-Inverse Solution

According to some aspects, when the condition of the matrix $\vec{U}_m{}^T\vec{U}_m$ is found to be sufficient in the Matrix Condition process (1506), the solution vector, $\vec{\xi}_m$, is evaluated through application of the Moore-Penrose pseudo-inverse technique, in Equation 73.

$$\vec{\xi}_m = (\vec{U}_m{}^T \cdot \vec{U}_m)^{-1} \cdot (\vec{U}_m{}^T \cdot \vec{y}_m) \qquad \text{Equation 73}$$

The stator inductance, $L_{S,m}$, the total leakage factor, $\sigma_m$, and the initial rotor time constant, $\tau_{R,0,m}$, are directly evaluated from the solution vector according to Equations 43-45, respectively.

Figure 17:
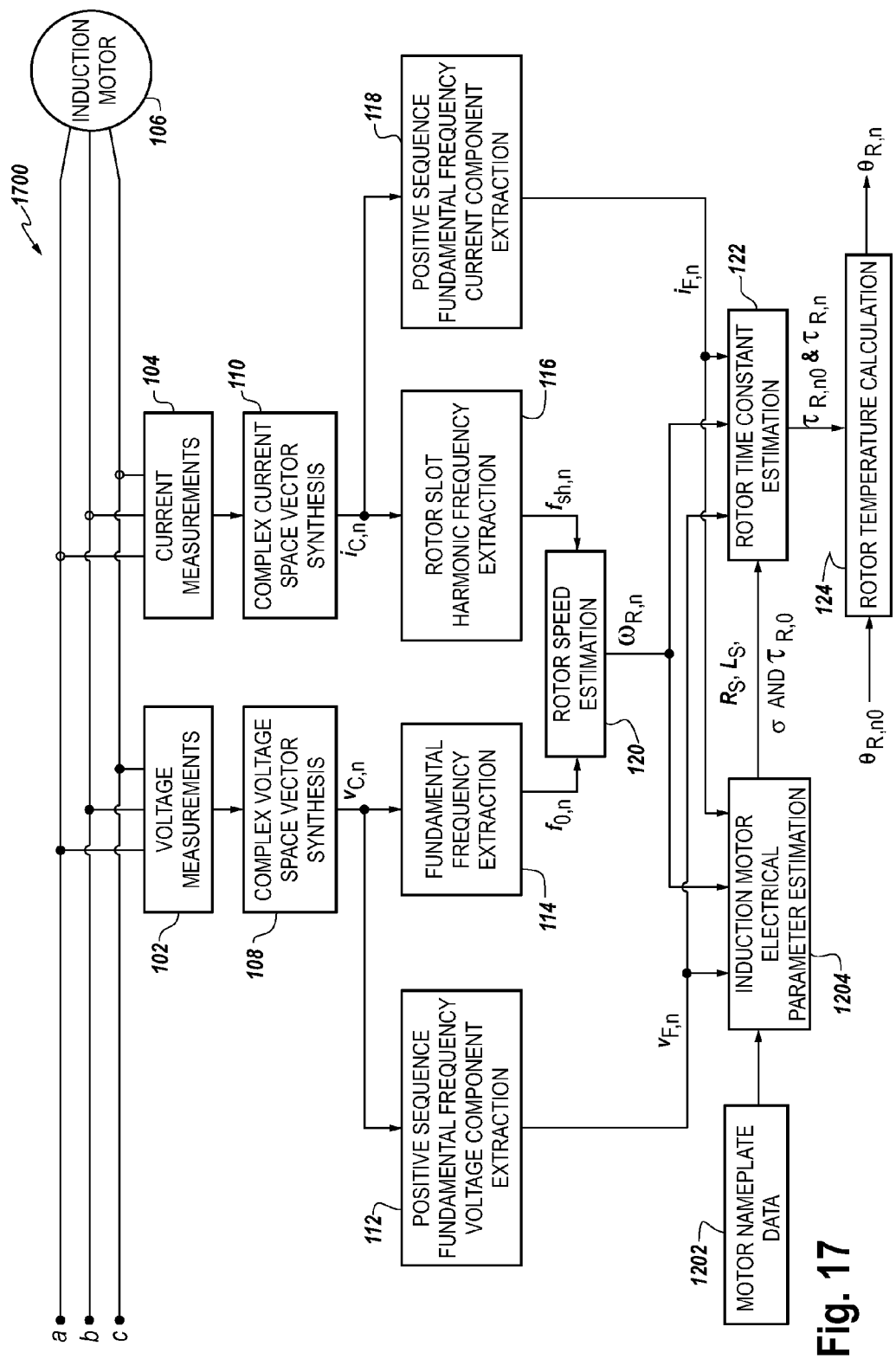
FIG. 17 is a block diagram illustrating a method and apparatus for estimating induction motor electrical parameters, as well rotor temperature, according to some aspects of the present concepts.

FIG. 17 illustrates an architecture (1700) used to track an induction motor rotor temperature in accordance with some aspects of the present disclosure. Once the induction motor electrical parameters, $R_S$, $L_S$, $\sigma$ and $\tau_{R,0}$, are accurately and reliably estimated (1204), as described above, the parameters are fed into the rotor time constant estimation block (122). The quantity, $\tau_{R,0}$, is used as the initial rotor time constant value in a model-reference adaptive system inside the rotor time constant estimation block (122). Furthermore, this $\tau_{R,0}$ can also be used as an approximate indicator and be associated with the baseline rotor time constant and temperature pair $(\tau_{R,n0}, \theta_{R,n0})$, which is used to calculate the rotor temperature, $\theta_{R,n}$, (124) from the rotor time constant, $\tau_{R,n}$. The quantity $\tau_{R,n}$ being the output of the rotor time constant estimation block (122).

While particular aspects, embodiments, and applications of the present invention have been illustrated and described, it is to be understood that the invention is not limited to the precise construction and compositions disclosed herein and that various modifications, changes, and variations be apparent from the foregoing descriptions without departing from the spirit and scope of the invention as defined in the appended claims.

What is claimed is:

1. A method of estimating electrical parameters associated with an induction motor from a solution vector formed based on known quantities relating to the motor, comprising:
    forming a source matrix U that includes a plurality of vectors, each having known quantities relating to the motor and each being associated with a different time relative to the other vectors in the source matrix U;
    forming a source vector y that includes a plurality of elements, each having a known quantity relating to the motor and each being associated with the same time as is each respective vector of the plurality of vectors;
    determining whether replacing a selected vector of the plurality of vectors in the source matrix U to form a candidate source matrix with a candidate vector having known quantities relating to the motor would satisfy at least a first criterion;
    responsive to the determining satisfying the first criterion, modifying the source matrix U to replace the selected vector with the candidate vector, and modifying the source vector y to replace a first of the plurality of elements with an element associated with the same time as is the candidate vector;
    determining whether a condition related to the modified source matrix satisfies at least a second criterion;
    responsive to the condition satisfying the second criterion, calculating the solution vector from a function including the modified source matrix and the modified source vector to produce at least one electrical parameter associated with the motor; and
    storing the at least one electrical parameter.

2. The method of claim 1, further comprising calculating the known quantities of the plurality of vectors of the source matrix U from any one or more of a representation of a fundamental voltage associated with the motor, a representation of a fundamental current associated with the motor, a rotor speed of the motor, and a stator resistance associated with the motor.

3. The method of claim 1, further comprising calculating the known quantity of the plurality of elements of the source vector y according to a function that includes a representation of a fundamental current associated with the motor and a rotor speed of the motor.

4. The method of claim 1, wherein the first criterion is based on whether the replacement of the selected vector with the candidate vector would cause a product of (a) the transpose of the modified source matrix and (b) the modified source matrix to have an improved condition compared to a product of (a) the transpose of the source matrix U and (b) the source matrix U.

5. The method of claim 1, wherein the determining whether replacing the selected vector would satisfy the first criterion includes:
    forming a diversity set that includes a plurality of elements, each having a known quantity relating to the motor and each being associated with the same time as is each respective vector of the plurality of vectors;
    determining whether to replace an element in the diversity set with a new element associated with a new time by:
        replacing one of the plurality of elements with the new element to produce a plurality of candidate diversity sets;
        determining a maximum candidate minimum distance between any two elements in the plurality of candidate diversity sets; and
        responsive to the maximum candidate minimum distance being not less than a corresponding minimum distance associated with the diversity set, replacing an element in the diversity set with the new element to produce a modified diversity set such that the modified diversity set corresponds to the candidate diversity set associated with the maximum candidate minimum distance, and determining that the first criterion is satisfied.

6. The method of claim 5, wherein the determining whether to replace the element in the diversity set with the new element includes:
    responsive to the maximum candidate minimum distance being equal to the corresponding minimum distance associated with the diversity set, calculating a candidate mean distance; and
    responsive to the candidate mean distance being greater than a mean distance associated with the diversity set, determining that the first criterion is satisfied.

7. The method of claim 6, wherein the candidate minimum distance corresponds to a minimum Euclidian distance, and wherein the candidate mean distance corresponds to a mean Euclidian distance, with respect to the elements in a specific candidate diversity set.

8. The method of claim 5, wherein the known quantity relating to the motor of the plurality of elements is a representation of input power to the motor or a representation of the input impedance of the motor.

9. The method of claim 1, wherein the second criterion is based on whether the condition of a product of (a) the transpose of the modified source matrix and (b) the modified source matrix is sufficient to support calculating the solution vector.

10. The method of claim 9, wherein the condition of the product of (a) the transpose of the modified source matrix and (b) the modified source matrix is approximated by:
   extracting a plurality of eigenvalues of a matrix that is formed as a product of (a) the transpose of the modified source matrix and (b) the modified source matrix;
   calculating a condition number as a function that includes the ratio of a maximum eigenvalue and a minimum eigenvalue of the plurality of eigenvalues; and
   determining whether the condition number is less than a maximum condition number, and, if so, determining that the second criterion is satisfied.

11. The method of claim 1, wherein the second criterion is based on whether the condition of the product of (a) the transpose of the modified source matrix and (b) the modified source matrix is sufficient to support calculating the solution vector, wherein the condition is approximated by determining whether a maximum candidate minimum distance associated with a diversity set exceeds a minimum distance threshold, and, if so, determining that the second criterion is satisfied.

12. The method of claim 1, wherein the calculating the solution vector is carried out responsive to satisfying the second criterion, such that the accuracy of the at least one electrical parameter produced from the solution vector improves corresponding to improvement in the condition of the product of (a) the transpose of the modified source matrix and (b) the modified source matrix.

13. The method of claim 1, wherein the function for calculating the solution vector is a pseudo-inverse function.

14. The method of claim 1, wherein the at least one electrical parameter is any one or more of a stator inductance, a total leakage factor, and a rotor time constant.

15. A method of estimating electrical parameters of an induction motor during dynamic or steady-state operation of the motor, the method comprising:
   determining a representation of a current signal associated with the motor;
   determining a representation of a voltage signal associated with the motor;
   determining a rotor speed of the motor according to a function that includes a fundamental frequency extracted from the representation of the voltage signal or a rotor slot harmonic frequency extracted from the representation of the current signal, or both;
   extracting from the representation of the voltage signal a fundamental frequency voltage component;
   extracting from the representation of the current signal a fundamental frequency current component;
   determining at least one electrical parameter of the motor according to a function that includes the fundamental frequency voltage component, the fundamental frequency current component, and the rotor speed; and
   storing the at least one electrical parameter.

16. The method of claim 15, wherein the rotor speed function includes the fundamental frequency extracted from the representation of the voltage signal, the rotor slot harmonic frequency extracted from the representation of the current signal, a stator winding distribution harmonic order, a rotor magnetomotive force distribution harmonic order, a number of rotor slots of the motor, and a number of pole-pairs of the motor.

17. The method of claim 15, wherein the determining the rotor speed is carried out via a speed sensing device coupled to a rotor of the motor.

18. The method of claim 15, further comprising receiving motor nameplate data of the motor, wherein the function for determining the at least one electrical parameter further includes the motor nameplate data.

19. The method of claim 15, wherein the at least one electrical parameter is any one or more of a stator inductance, a total leakage factor, and a rotor time constant.

20. The method of claim 15, wherein the function for determining the at least one electrical parameter is a least-squares function.

21. A method of estimating electrical parameters of an induction motor, the method comprising:
   determining a representation of a current signal associated with the motor;
   determining a representation of a voltage signal associated with the motor;
   determining a rotor speed of the motor;
   extracting from the representation of the voltage signal a fundamental frequency voltage component;
   extracting from the representation of the current signal a fundamental frequency current component;
   determining at least one electrical parameter of the motor according to a function that includes the fundamental frequency voltage component, the fundamental frequency current component, and the rotor speed; and
   storing the at least one electrical parameter,
   wherein the representation of the voltage signal is determined by calculating a complex voltage space vector from voltage measurements of the voltage signal, and the representation of the current signal is determined by calculating a complex current space vector from current measurements of the current signal.

22. The method of claim 21, wherein the voltage signal is a three-phase voltage signal and the voltage measurements are measured from the voltage differences between at least one of the three phases of the three-phase voltage signal and either every other phase of the three phases or a voltage reference point, and wherein the current signal is a three-phase current signal and the current measurements are measured from at least two of the three phases of the three-phase current signal.

23. The method of claim 21, further comprising:
   calculating an approximation of a first-order continuous-time derivative of the fundamental frequency current component of the complex current space vector and of the fundamental frequency voltage component of the complex voltage space vector; and
   calculating an approximation of a second-order continuous-time derivative of the fundamental frequency current component of the complex current space vector.

24. The method of claim 23, further comprising:
   forming a vector, u, that includes the first-order continuous-time derivative of the fundamental frequency voltage component, the fundamental frequency voltage component, a stator resistance of the motor, the rotor speed, the fundamental frequency current component, and the first-order continuous-time derivative of the fundamental frequency current component; and
   calculating a quantity, y, that includes the rotor speed, the first-order continuous-time derivative of the fundamental frequency current component, and the second-order continuous-time derivative of the fundamental frequency current component.

25. The method of claim 21, wherein the complex voltage space vector includes a fundamental frequency voltage component and the complex current space vector includes a fundamental frequency current component, the method further comprising:
approximating a first-order time derivative of the fundamental frequency voltage component according to a function that includes at least two samples of the complex fundamental frequency voltage component and a sampling interval; and
approximating a first-order time derivative of the fundamental frequency current component according to a function that includes at least two samples of the complex fundamental frequency current component and a sampling interval.

26. The method of claim 25, wherein the function for approximating the first-order time derivative of the complex fundamental frequency voltage component includes a forward difference formula or a backward difference formula, and wherein the function for approximating the first-order time derivative of the complex fundamental frequency current component includes the forward difference formula or the backward difference formula.

27. The method of claim 25, wherein the function for approximating the first-order time derivative of the complex fundamental frequency voltage component includes at least a three-point formula and the at least two samples of the complex fundamental frequency voltage component is at least three samples of the complex fundamental frequency voltage component, and wherein the function for approximating the first-order time derivative of the complex fundamental frequency current component includes at least a three-point formula and the at least two samples of the complex fundamental frequency current component is at least three samples of the complex fundamental frequency current component.

28. The method of claim 25, wherein the function for approximating the first-order time derivative of the complex fundamental frequency voltage component includes at least a five-point formula and the at least two samples of the complex fundamental frequency voltage component is at least five samples of the complex fundamental frequency voltage component, and wherein the function for approximating the first-order time derivative of the complex fundamental frequency current component includes at least a five-point formula and the at least two samples of the complex fundamental frequency current component is at least five samples of the complex fundamental frequency current component.

29. The method of claim 25, wherein the function for approximating the first-order time derivative of the complex fundamental frequency voltage component includes a Kaiser window function, or wherein the function for approximating the first-order time derivative of the complex fundamental frequency current component includes the Kaiser window function.

30. The method of claim 25, further comprising approximating a second-order time derivative of the complex fundamental frequency current component according to the function for approximating the first-order time derivative of the complex fundamental frequency current component.

31. A method of estimating electrical parameters of an induction motor, the method comprising:
determining a representation of a current signal associated with the motor;
determining a representation of a voltage signal associated with the motor;
determining a rotor speed of the motor;
extracting from the representation of the voltage signal a fundamental frequency voltage component;
extracting from the representation of the current signal a fundamental frequency current component;
receiving motor nameplate data of the motor, wherein the motor nameplate data includes a nameplate voltage and a nameplate current;
the method further comprising calculating a stator resistance of the motor according to a function that includes the nameplate voltage and the nameplate current;
determining at least one electrical parameter of the motor according to a function that includes the fundamental frequency voltage component, the fundamental frequency current component, the rotor speed, and the motor nameplate data; and
storing the at least one electrical parameter.

32. The method of claim 31, wherein the function for calculating the stator resistance includes dividing the nameplate voltage by the nameplate current and multiplying by a scalar constant.

33. A method of estimating electrical parameters of an induction motor, the method comprising:
determining a representation of a current signal associated with the motor;
determining a representation of a voltage signal associated with the motor;
determining a rotor speed of the motor;
extracting from the representation of the voltage signal a fundamental frequency voltage component;
extracting from the representation of the current signal a fundamental frequency current component;
determining at least one electrical parameter of the motor according to a least-squares function that includes the fundamental frequency voltage component, the fundamental frequency current component, and the rotor speed; and
storing the at least one electrical parameter,
wherein the least-squares function includes:
forming a source matrix U that includes a plurality of vectors, each having known quantities relating to the motor and each being associated with a different load level relative to the other vectors in the source matrix U;
forming a source vector y that includes a plurality of elements, each having a known quantity relating to the motor and each being associated with the same time as is each respective vector of the plurality of vectors; and
calculating a solution vector according to a function that includes the source matrix U and the source vector y, wherein the at least one electrical parameter is determined from the solution vector.

34. The method of claim 33, wherein the calculating the solution vector includes calculating the product of a matrix inverse of a first matrix and the transpose of the source matrix U multiplied by the source vector y, wherein the first matrix is the product of the transpose of the source matrix U multiplied by the source matrix U.

35. The method of claim 33, further comprising:
calculating the known quantities of the plurality of vectors of the source matrix U according to functions that are based on any one or more of the fundamental frequency voltage component, the fundamental frequency current component, the rotor speed of the motor, and a stator resistance associated with the motor; and
calculating the known quantity of the plurality of elements of the source vector y according to a function that is based on the fundamental frequency current component and the rotor speed of the motor.

36. The method of claim 35, further comprising temporally aligning a row of the known quantities of the plurality of vectors and a corresponding row of the known quantity of the plurality of elements with respect to one another, by introducing at least one time delay to compensate for latencies caused by a numerical differentiation block that approximates a continuous-time derivative of a quantity such that the source matrix U and the source vector y are formed substantially synchronously.

37. The method of claim 33, wherein the determining the at least one electrical parameter includes determining whether a new set of known quantities relating to the motor at a new time is qualified by:
calculating an intermediate index based on an electrical characteristic relating to the motor at the new time and at each time corresponding to the plurality of vectors of the source matrix U and the plurality of elements of the source vector y,
calculating a diversity index by calculating the minimum distance between pairs of the intermediate indices, and
comparing the diversity index to a threshold based on motor nameplate data of the motor, and, if the diversity index exceeds the threshold, qualifying the new set of known quantities and appending a new vector to the source matrix U based on at least some of the known quantities in the new set and a new quantity to the source vector y based on at least some of the known quantities in the new set.

38. The method of claim 37, wherein the electrical characteristic is a representation of a complex input power to the motor.

39. The method of claim 37, wherein the determining the at least one electrical parameter further includes calculating an inverse of a first matrix multiplied by a second matrix, wherein the first matrix is the transpose of the source matrix U multiplied by the source matrix U plus the transpose of the new vector multiplied by the new vector, and wherein the second matrix is the transpose of the source matrix U multiplied by the source vector y plus the transpose of the new vector multiplied by the new quantity.

* * * * *